United States Patent
Cardona et al.

(10) Patent No.: US 12,095,443 B2
(45) Date of Patent: Sep. 17, 2024

(54) TRANSVERSELY-EXCITED FILM BULK ACOUSTIC RESONATOR WITH REDUCED SUBSTRATE TO CONTACT BUMP THERMAL RESISTANCE

(71) Applicant: Murata Manufacturing Co., Ltd., Nagaokakyo (JP)

(72) Inventors: Albert Cardona, Santa Barbara, CA (US); Chris O'Brien, Santa Barbara, CA (US); Greg Dyer, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 526 days.

(21) Appl. No.: 17/507,550

(22) Filed: Oct. 21, 2021

(65) Prior Publication Data
US 2023/0006129 A1   Jan. 5, 2023

Related U.S. Application Data

(63) Continuation of application No. 17/506,571, filed on Oct. 20, 2021.
(Continued)

(51) Int. Cl.
*H10N 30/06* (2023.01)
*H03H 9/02* (2006.01)
(Continued)

(52) U.S. Cl.
CPC .......... *H03H 9/13* (2013.01); *H03H 9/02015* (2013.01); *H03H 9/15* (2013.01);
(Continued)

(58) Field of Classification Search
CPC ........ H03H 9/02015; H03H 9/15; H03H 9/54; H03H 3/02; H03H 9/6406; H10N 30/05;
(Continued)

(56) References Cited

U.S. PATENT DOCUMENTS

| 5,274,345 A | 12/1993 | Gau |
| 5,446,330 A | 8/1995 | Eda et al. |

(Continued)

FOREIGN PATENT DOCUMENTS

| JP | 2010109949 A | 5/2010 |
| WO | 2016017104 | 2/2016 |
| WO | 2018003273 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 Sep. 6, 2017.

(Continued)

*Primary Examiner* — Donghai D Nguyen
(74) *Attorney, Agent, or Firm* — ArentFox Schiff LLP

(57) ABSTRACT

An acoustic resonator device with low thermal impedance has a substrate and a single-crystal piezoelectric plate having a back surface attached to a top surface of the substrate via a bonding oxide (BOX) layer. An interdigital transducer (IDT) formed on the front surface of the plate has interleaved fingers disposed on the diaphragm, the overlapping distance of the interleaved fingers defining an aperture of the resonator device. Contact pads are formed at selected locations over the surface of the substrate to provide electrical connections between the IDT and contact bumps to be attached to the contact pads. The piezoelectric plate is removed from at least a portion of the surface area of the device beneath each of the contact pads to provide lower thermal resistance between the contact bumps and the substrate.

21 Claims, 15 Drawing Sheets

Section A-A

Related U.S. Application Data

(60) Provisional application No. 63/216,525, filed on Jun. 30, 2021.

(51) Int. Cl.
| | |
|---|---|
| *H03H 9/13* | (2006.01) |
| *H03H 9/15* | (2006.01) |
| *H03H 9/17* | (2006.01) |
| *H03H 9/54* | (2006.01) |
| *H03H 9/56* | (2006.01) |
| *H10N 30/05* | (2023.01) |
| *H10N 30/20* | (2023.01) |

(52) U.S. Cl.
CPC ............ *H03H 9/17* (2013.01); *H03H 9/54* (2013.01); *H03H 9/568* (2013.01); *H10N 30/05* (2023.02); *H10N 30/06* (2023.02); *H10N 30/20* (2023.02)

(58) Field of Classification Search
CPC ...... H10N 30/06; H10N 30/708; H10N 30/85; H10N 30/87; Y10T 29/42; Y10T 29/49005; Y10T 29/49155
See application file for complete search history.

(56) References Cited

U.S. PATENT DOCUMENTS

| | | | |
|---|---|---|---|
| 5,552,655 A | 9/1996 | Stokes et al. | |
| 5,726,610 A | 3/1998 | Allen et al. | |
| 5,853,601 A | 12/1998 | Krishaswamy | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,707,229 B1 | 3/2004 | Martin | |
| 6,710,514 B2 | 3/2004 | Ikada et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,491,192 B1 * | 11/2019 | Plesski | H03H 3/02 |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 2002/0079986 A1 | 6/2002 | Ruby et al. | |
| 2002/0130736 A1 | 9/2002 | Mukai | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0100164 A1 | 5/2004 | Murata | |
| 2004/0261250 A1 | 12/2004 | Kadota et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2010/0064492 A1 | 3/2010 | Tanaka | |
| 2010/0107388 A1 | 5/2010 | Iwamoto | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |
| 2011/0109196 A1 | 5/2011 | Goto et al. | |
| 2011/0278993 A1 | 11/2011 | Iwamoto | |
| 2012/0286900 A1 | 11/2012 | Kadota et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0009032 A1 | 1/2014 | Takahashi et al. | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0042417 A1 | 2/2015 | Onodera et al. | |
| 2015/0165479 A1 | 6/2015 | Lasiter et al. | |
| 2015/0319537 A1 | 11/2015 | Perois et al. | |
| 2015/0333730 A1 | 11/2015 | Meltaus et al. | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179225 A1 | 6/2017 | Kishimoto | |
| 2017/0179928 A1 | 6/2017 | Raihn et al. | |
| 2017/0214381 A1 | 7/2017 | Bhattacharjee | |
| 2017/0214387 A1 | 7/2017 | Burak et al. | |
| 2017/0222617 A1 | 8/2017 | Mizoguchi | |
| 2017/0222622 A1 | 8/2017 | Solal et al. | |
| 2017/0264266 A1 | 9/2017 | Kishimoto | |
| 2017/0370791 A1 | 12/2017 | Nakamura et al. | |
| 2018/0005950 A1 | 1/2018 | Watanabe | |
| 2018/0026603 A1 | 1/2018 | Iwamoto | |
| 2018/0033952 A1 | 2/2018 | Yamamoto | |
| 2018/0041191 A1 | 2/2018 | Park | |
| 2018/0062615 A1 | 3/2018 | Kato et al. | |
| 2018/0062617 A1 | 3/2018 | Yun et al. | |
| 2018/0123016 A1 | 5/2018 | Gong | |
| 2018/0191322 A1 | 7/2018 | Chang et al. | |
| 2018/0278227 A1 | 9/2018 | Hurwitz | |

(56) References Cited

U.S. PATENT DOCUMENTS

| | | |
|---|---|---|
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0386636 A1 | 12/2019 | Plesski et al. |
| 2020/0036357 A1 | 1/2020 | Mimura |
| 2020/0235719 A1 | 7/2020 | Yantchev et al. |
| 2020/0259480 A1 | 8/2020 | Pensala |
| 2020/0313645 A1 | 10/2020 | Caron |
| 2020/0350891 A1 | 11/2020 | Turner |
| 2021/0013859 A1 | 1/2021 | Turner et al. |
| 2023/0027129 A1* | 1/2023 | Caron ................. H03H 9/6406 |

OTHER PUBLICATIONS

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. Jun. 5, 2018.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. May 00 May 2018.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945 Jan. 22, 2017.

USPTO/ISA, International Search Report and Written Opinion for PCT Application No. PCT/US2019/036433 dated Aug. 29, 2019. Aug. 29, 2019.

Buchanan "Ceramic Materials for Electronics" 3rd Edition, first published in 2004 by Marcel Dekker, Inc. pp. 496 (Year 2004). 00 Jan. 2004.

Moussa et al.Review on Triggered Liposomal Drug Delivery with a Focus on Ultrasound2015, Bentham Science Publishers, pp. 16 (Year 2005) 00 Jan. 2005.

Acoustic Properties of SolidsONDA Corporation592 Weddell Drive, Sunnyvale, CA 94089, Apr. 11, 2003, pp. 5 (Year 2003) Apr. 11, 2003.

Sorokin et al.Study of Microwave Acoustic Attenuation in a Multi-frequency Bulk Acoustic Resonator Based on a Synthetic Diamond Single CrystalPublished in Acoustical Physics, vol. 61, No. 6, 2015 pp. 675 (Year 2015) 00 Jan. 2015.

Zou, Jie "High-Performance Aluminum Nitride Lamb Wave Resonators for RF Front-End Technology" University of California, Berkeley, Summer 2015, pp. 63 (Year 2015) 00 Jan. 2015.

Bahreynl, B.Fabrication and Design of Resonant MicrodevicesAndrew William, Inc. 2018, NY (Year 2008) 00 Jan. 2008.

International Search Report and Written Opinion for PCT Application No. PCT/US2019/058632 dated Jan. 17, 2020. Jan. 17, 2020.

G. Manohar, Investigation of Various Surface Acoustic Wave Design Configurations for Improved Sensitivity, Jan. 2012, Doctoral dissertation, University of South Florida, USA Jan. 2012.

Ekeom, D. & Dubus, Bertrand & Volatier, A., Solidly mounted resonator (SMR) FEM-BEM simulation, 2006, 1474-1477, 10.1109/ULTSYM.2006.371. 2006.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Safari et al. "Piezoelectric for Transducer Applications" published by Elsevier Science Ltd., pp. 4 (Year: 2000). 2020.

Material Properties of Tibtech Innovations, © 2018 TIBTECH Innovations (Year 2018). 2018.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190. 2014.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi: 10.1002/ecja. 4410690406 1986.

Naumenko et al., "Optimal orientations of Lithium Niobate for resonator SAW filters", 2003 IEEE Ultrasonics SYMPOSIUM—pp. 2110-2113. (Year: 2003) 2003.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Webster Dictionary, Meaning of "diaphragm" Merriam Webster since 1828. 1828.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

* cited by examiner

| Thickness SiO2 (um) | Thickness LN (um) | Bump Contact Area (um^2) | Bump Thermal Resistance (C/W) | Relative Change |
|---|---|---|---|---|
| 0 | 0.5 | 10000 | 12 | 85% |
| 1 | 0.5 | 10000 | 78.6 | N/A |
| 2 | 0.5 | 10000 | 145.2 | N/A |
| 5 | 0.5 | 10000 | 345.2 | N/A |
| 10 | 0.5 | 10000 | 678.6 | N/A |
| 0 | 0 | 10000 | 0 | -100% |
| 1 | 0 | 10000 | 66.7 | -15% |
| 2 | 0 | 10000 | 133.3 | -8% |
| 5 | 0 | 10000 | 333.3 | -3% |
| 10 | 0 | 10000 | 666.7 | -2% |

FIG. 6

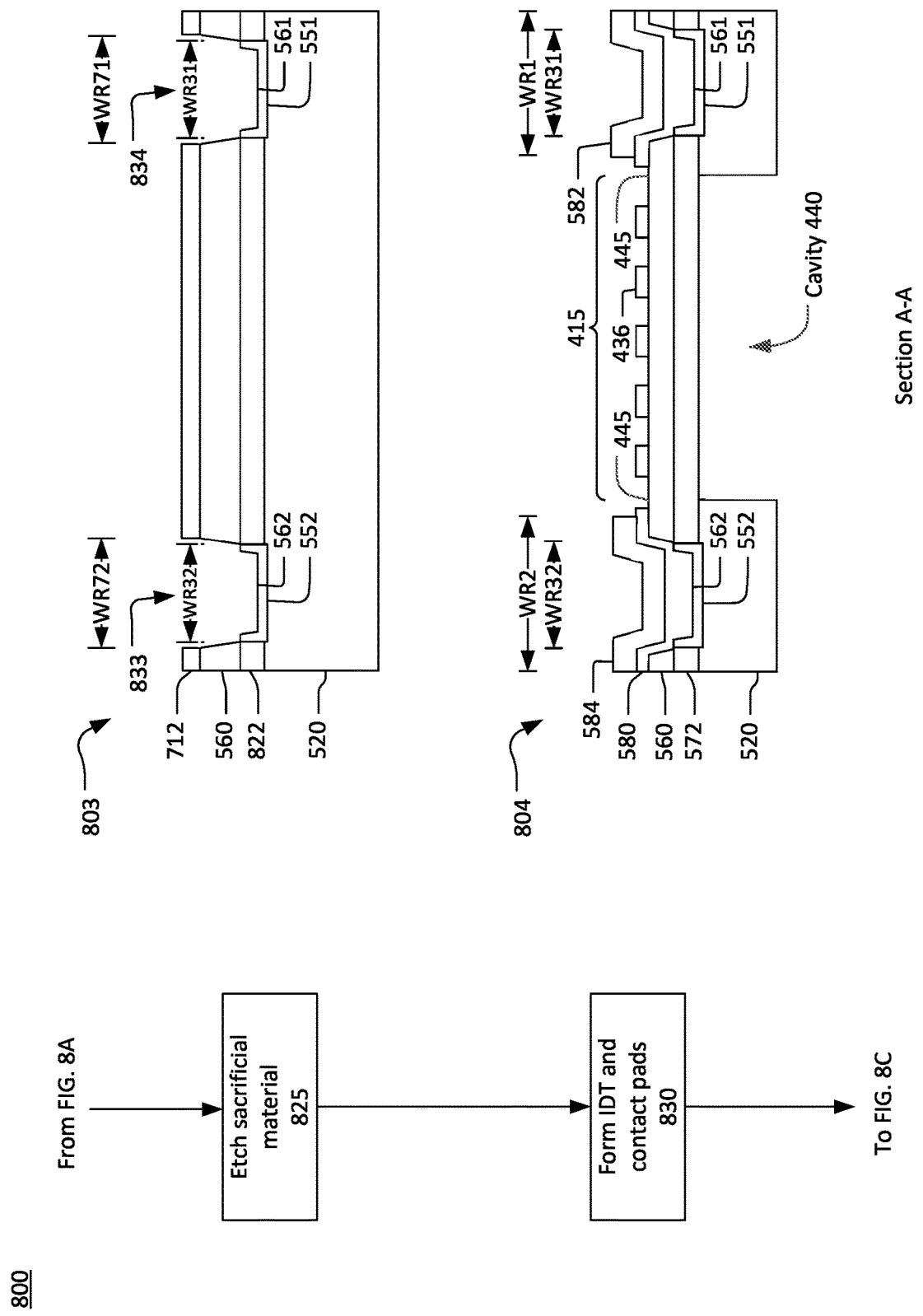

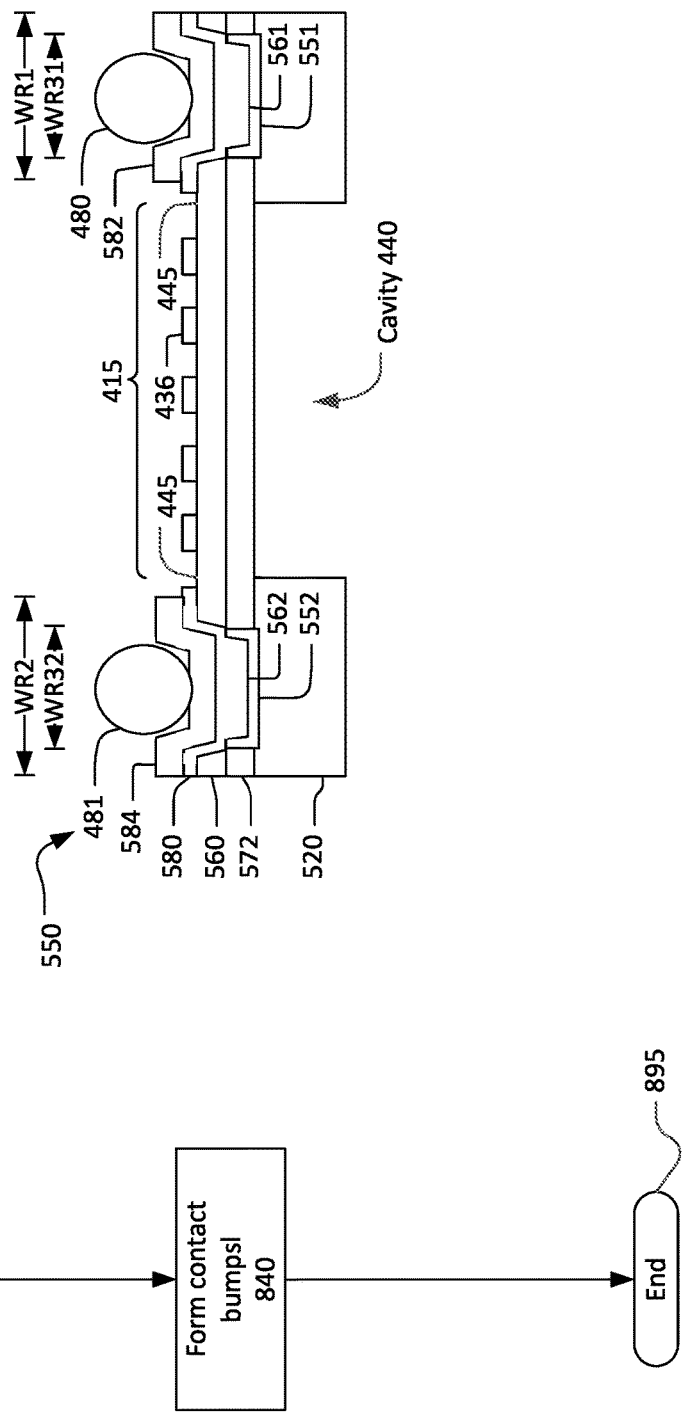

TRANSVERSELY-EXCITED FILM BULK ACOUSTIC RESONATOR WITH REDUCED SUBSTRATE TO CONTACT BUMP THERMAL RESISTANCE

RELATED APPLICATION INFORMATION

This patent is a continuation of U.S. patent application Ser. No. 17/506,571, titled TRANSVERSELY-EXCITED FILM BULK ACOUSTIC RESONATOR WITH REDUCED SUBSTRATE TO CONTACT BUMP THERMAL RESISTANCE, filed Oct. 20, 2021, which claims priority to U.S. provisional patent application 63/216,525, filed Jun. 30, 2021, entitled METHOD TO IMPROVE BUMP THERMAL RESISTANCE, all of which are incorporated herein by reference.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 6 is a table showing a bump thermal resistance analysis of XBAR devices with and without the piezoelectric plate removed from a least a portion of the surface area of the device beneath the contact pads.

FIG. 8A, FIG. 8B, and FIG. 8C (collectively "FIG. 8") are a flow chart of a process for fabricating an XBAR with the piezoelectric plate and bonding oxide (BOX) layer removed from a least a portion of the surface area of the device beneath the contact pads.

Figure 1:
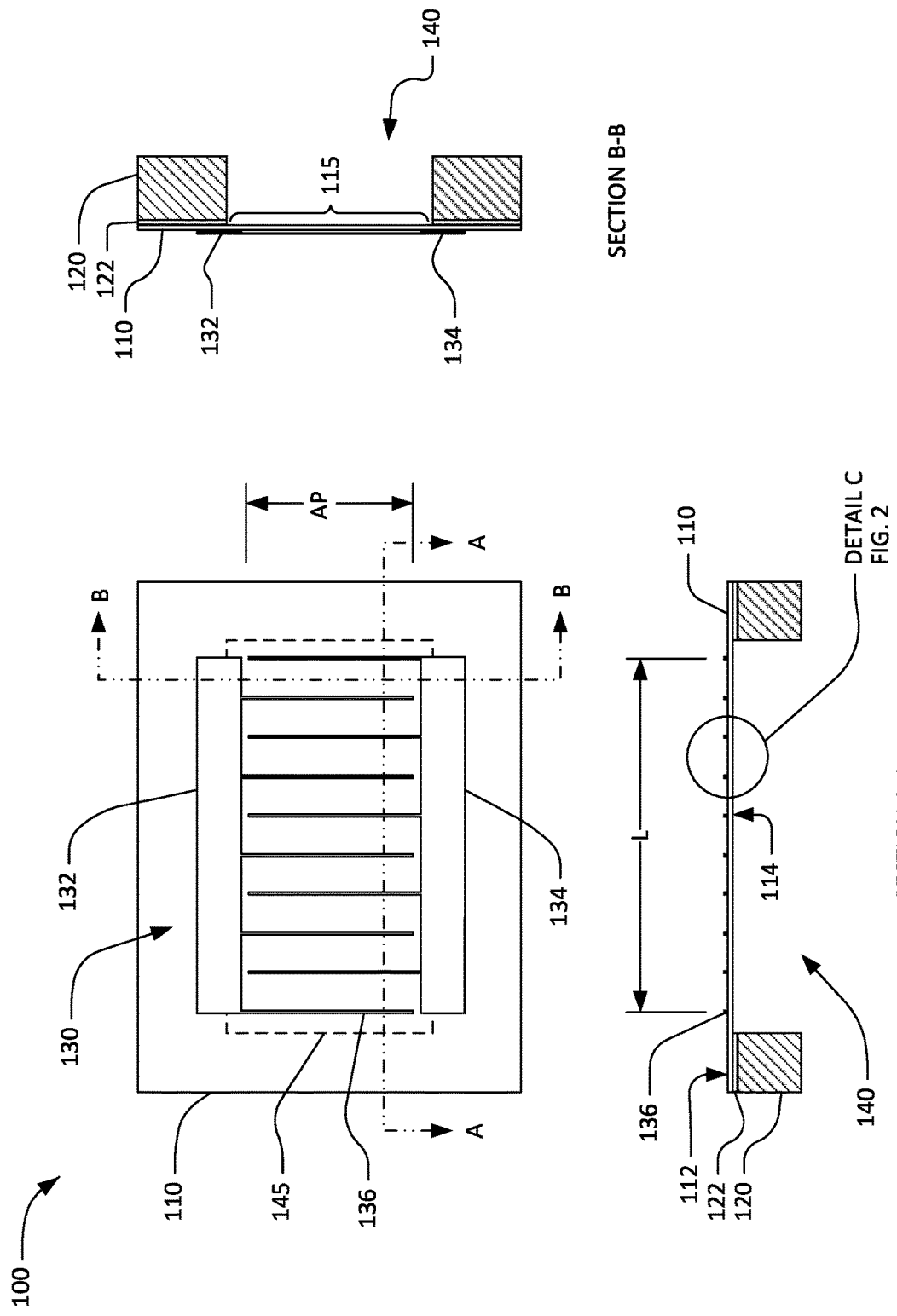
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on a diaphragm or membrane. Contact pads can be formed at selected locations over the surface of the substrate to provide electrical connections between the IDT and contact bumps to be attached to or formed on the contact pads.

The primary mechanism for removing heat from the XBAR diaphragm is conduction through the IDT fingers to the substrate and then from the substrate through the contact pads and contact bumps to a package that houses the XBAR. However, the contact pads and other conductors of the conductor pattern are separated from the substrate by the piezoelectric layer and usually a layer of bonding oxide (BOX). The low thermal conductivity of the piezoelectric layer and BOX layer presents a substantial barrier to efficient heat removal from the substrate and through the contact pads and bumps.

The following describes improved XBAR resonators, filters and fabrication techniques for XBAR resonators that efficiently conduct heat from the substrate and through the contact pads by having the piezoelectric plate removed from a least a portion of the surface area of the device or substrate beneath each of the contact pads to provide lower thermal resistance between the contact bumps and the substrate. Removing the plate may reduce substrate to bump thermal resistance for the XBAR resonator by creating a thermal via under contact pads and to a bonding oxide layer or an electrically isolating layer that is in contact with the substrate.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers or predetermined areas of an electrically insulating material, such as of silicon thermal oxide (TOX), SiO2, polycrystalline silicon, and/or another dielectric material. The back surface 114 of the piezoelectric plate 110 or a diaphragm 115 including the plate may be bonded to the substrate 120 using a wafer bonding process, or grown on the substrate 120, or attached to the substrate in some other manner. The piezoelectric plate is attached directly to the substrate or may be attached to the substrate via a bonding oxide layer 122, such as a bonding oxide (BOX) layer of SiO2, or another oxide such as Al2O3.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity 140. "Cavity" has its conventional meaning of "an empty space within a solid body." The cavity 140 may contain a gas, air, or a vacuum. The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" 115 (for lack of a better term) due to its physical resemblance to the diaphragm of a microphone. As shown in FIG. 1, the diaphragm 115 is contiguous with the rest of the piezoelectric plate 110 around all of a perimeter 145 of the cavity 1. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter. The BOX layer may exist between the plate and substrate around perimeter 145 and may extend further away from the cavity than just within the perimeter itself. In the absence of a process to remove it (i.e., this invention) the BOX layer is everywhere between the piezoelectric plate and the substrate. The BOX layer is typically removed from the back of the diaphragm 115 as part of forming the cavity. The IDT 130 is positioned on the piezoelectric plate 110 such that at least the fingers 136 of the IDT 130 are disposed on the diaphragm 115 of the piezoelectric plate that spans, or is suspended over, the cavity 140.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
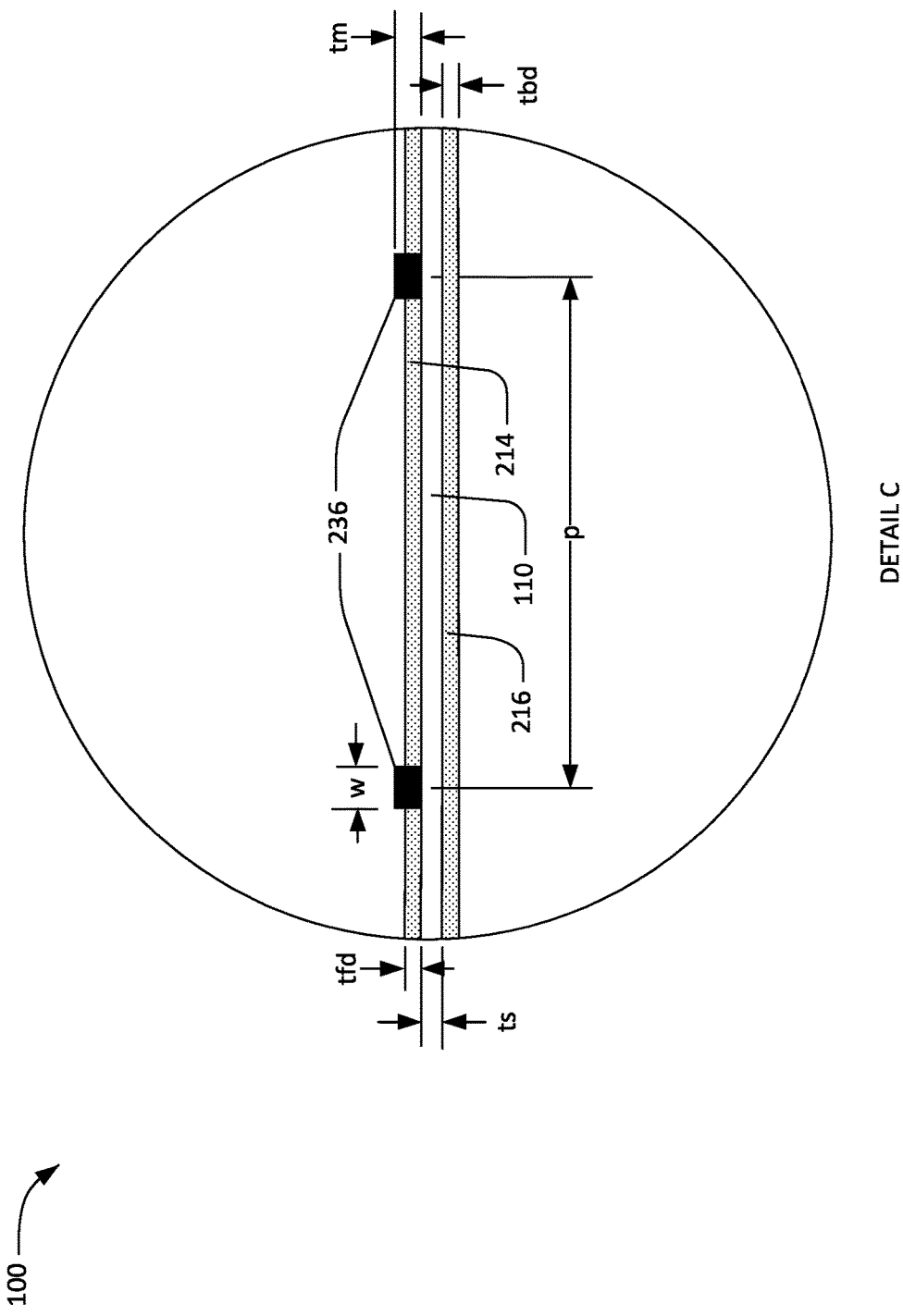
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands n77, n79), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer may be or include the BOX layer. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and bawrlck-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric layer.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
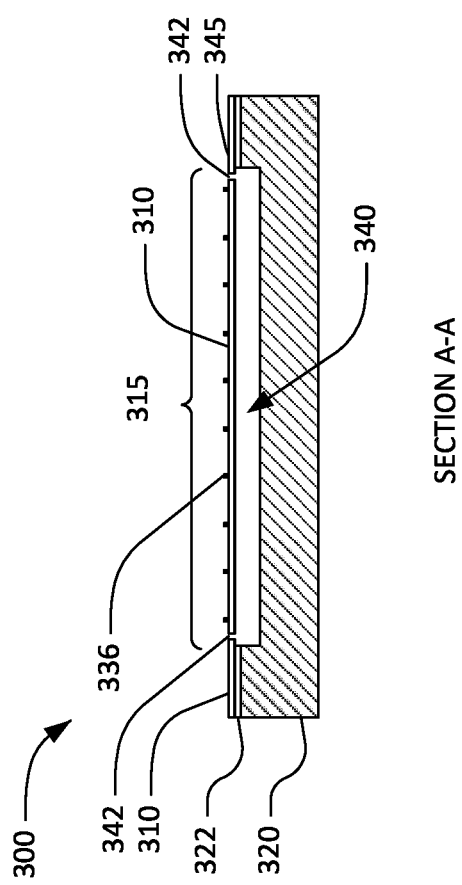
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136.

The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be or include a bonding layer, a BOX layer, an etch stop layer, a sealing layer, an adhesive layer or layer of other material that is attached or bonded to plate 310 and substrate 320. Layers 322 may be one or more of any of these layers or a combination of these layers. In other embodiments, the piezoelectric plate 310 is attached directly to the substrate 320 and an intermediary layer does not exist.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e., down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
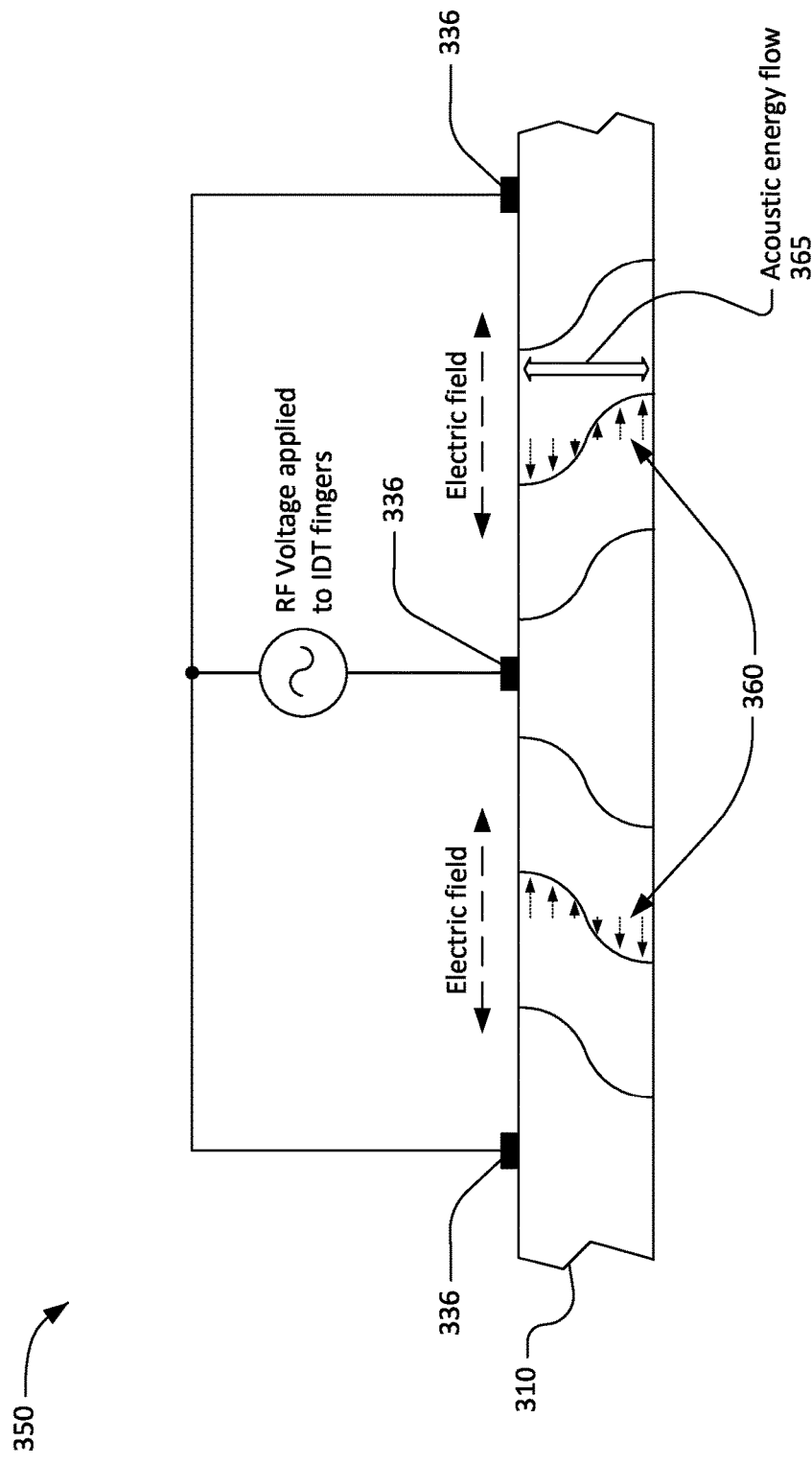
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 3C:
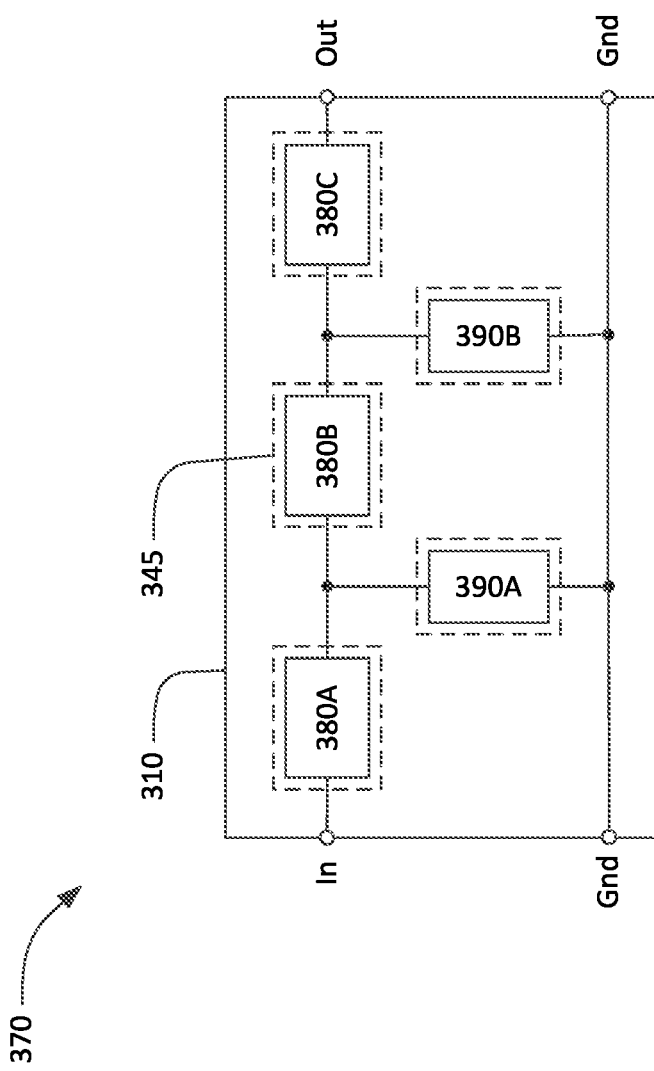
FIG. 3C is a schematic circuit diagram and layout for a high frequency band-pass filter using XBARs.

FIG. 3C is a schematic circuit diagram and layout for a high frequency band-pass filter 370 using XBARs. The filter 370 has a conventional ladder filter architecture including three series resonators 380A, 380B, 380C and two shunt resonators 390A, 390B. The three series resonators 380A, 380B, and 380C are connected in series between a first port and a second port. In FIG. 3C, the first and second ports are labeled "In" and "Out", respectively. However, the filter 370 is bidirectional and either port and serve as the input or output of the filter. The two shunt resonators 390A, 390B are connected from nodes between the series resonators to ground. All the shunt resonators and series resonators are XBARs on a single die.

The three series resonators 380A, B, C and the two shunt resonators 390A, B of the filter 370 are formed on a single plate 310 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 3C, the cavities are illustrated schematically as the dashed rectangles (such as the rectangle 345). In this example, each IDT is disposed over a respective cavity. In other filters, the IDTs of two or more resonators may be disposed over a single cavity.

Figure 4:
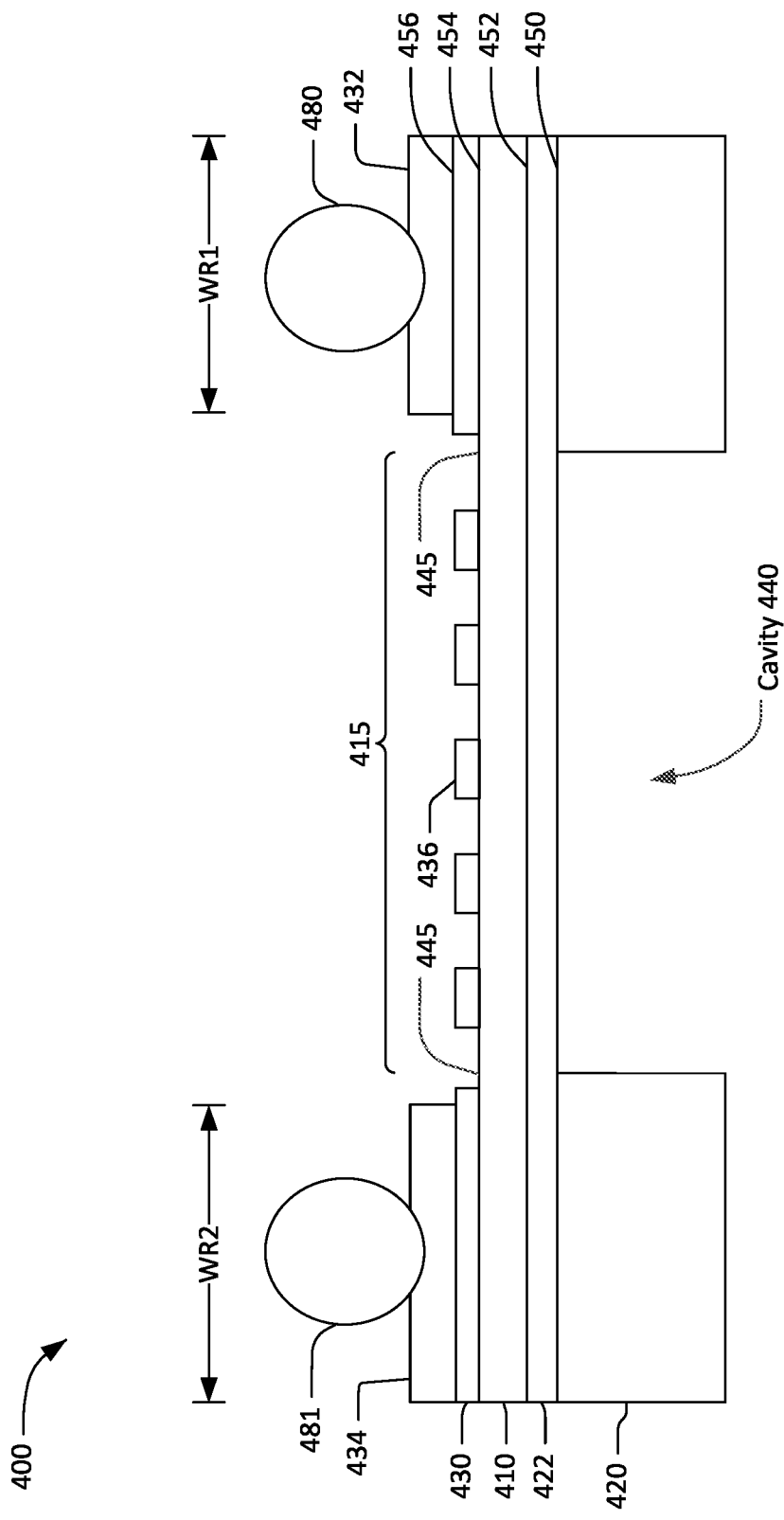
FIG. 4 is a schematic cross-sectional view of an XBAR with the piezoelectric plate over the surface area of the device beneath the contact pads.

FIG. 4 is a schematic cross-sectional view of an XBAR 400 with the piezoelectric plate over the surface area of the device beneath the contact pads 432 and 434. XBAR 400 has substrate 420 having a cavity 440. XBAR 400 may be a version of any of XBARs 100, 300 and/or 350. Substrate 420 has substrate top surface 450; bonding oxide (BOX) layer 422 has BOX top surface 452; plate 410 has plate top surface 454; and IDT 430 has top surface 456. Plate 410 has a plate back surface that is mounted on the BOX top surface 452; and BOX layer 422 has a back surface that is mounted on substrate top surface 450 at the perimeter 445 of cavity 440. BOX layer 422 may be removed from the plate in the area of cavity 440 such that that cavity extends upwards to the bottom surface of the plate 410.

A portion of the piezoelectric plate 410 that is not attached to BOX layer 422 over substrate 420 around (and possibly beyond) perimeter 445 forms diaphragm 415 that spans the cavity 440. The diaphragm 415 has a desired thickness for shunt or series resonators. In some cases, the thickness has a frontside dielectric (not shown) to form a shunt resonator. An interdigital transducer (IDT) 430 is formed on a front surface 454 of the piezoelectric plate 410 such that interleaved fingers 436 of the IDT are disposed on the diaphragm 415. The cavity 440 may be a swimming pool cavity. It may be either back etched or front etched through the plate.

XBAR 400 has contact pads 432 and 434 formed at selected locations or predetermined areas WR1 and WR2 for forming the contact pads, respectively, disposed above the surface 450 of the substrate 420. Contact pads 432 and 434 are formed on IDT 430 which is formed on plate 410 which is formed over substrate 420 on BOX layer 422 over areas WR1 and WR2, as shown. Contact bumps 480 and 481 are formed on, bonded to, or attached to the top surface of the contact pads 432 and 434, respectively, over areas WR1 and WR2, as shown.

The contact bumps 480 and 481 and contact pads herein may be formed of a metal or conductor such as gold (Au). They may be formed of the same material. The IDT and fingers 436 herein may be formed of a metal or conductor such as aluminum (Al). They may be formed of the same material. The piezoelectric plates herein may be formed of lithium niobate (LN), lithium tantalate (LT), or some other piezoelectric material; the BOX layers herein may be formed of $SiO_2$ or polycrystalline Si; and the substrates herein may be formed of Si.

For some XBAR devices herein, the interconnection from chip-scale device such as XBAR 400, 500, 550 and 900 to ceramic packages (not shown) includes a gold-to-gold process comprising of gold stud bumps 481 and 482 and flip chip technology to a package having gold contact pads opposite of and to attach to the gold stud bumps. In some cases, the gold bumps have a 65 μm diameter and are attached to the XBAR device contact pads (e.g., pad 432, 532 or 582) which have a circular or square shape with a 10,000 μm² area. The device die having the XBAR is then flip-chip mounted to the package (e.g., opposing contact pads) using thermo-compression or thermo-ultrasonic bonding.

This gold-to-gold interconnection serves both as an electrical signal pathway and a thermal pathway between the package and the XBAR. During RF operation, when a radio frequency signal applied to the IDT, such as from the package, through the bumps and to the IDT, heat is generated within the XBAR device and these pathways channel away this heat away from the XBAR, through the bumps and to the package. However, the interconnection has a thermal resistance between the XBAR and package that is determined by the materials properties of the path which includes the bump and the contact pads of the XBAR. The material stack-up of or at the XBAR contact pads can be a contact bump of gold (Au) having a thickness (e.g., up and down directions on the paper of FIGS. 2-5 and 7-9) of 0.5 μm, contact pad of aluminum (Al) having a thickness 0.3-0.5 μm, a piezoelectric plate of lithium niobium (0) having a thickness of 0.2-1.0 μm, a bonding oxide layer of silicon oxide ($SiO_2$) having a thickness of 1-2 μm (e.g., BOX layer 422 or 572; or isolating layer 551), and a base substrate of silicon (Si) having a thickness of 250-500 μm. The total thermal resistance is the aggregate of the intrinsic resistance of each material. Alternately, the $SiO_2$ bonding layer might be replaced by a polycrystalline silicon (poly-Si) bonding layer having a thickness of 1 μm-10 μm (e.g., BOX layer 422 or 572).

For XBAR 400, the primary mechanism for removing heat from the XBAR diaphragm 415, such as heat generated by the IDT and plate over cavity 440 is conduction through the IDT fingers 436 to the substrate 420 and then from the substrate through the contact pads 432/434 and contact bumps 480 and 481 to a package of the XBAR (not shown but attached to the contact bumps and housing the XBAR). However, the contact pads 432 and 434 and other conductors of the conductor pattern or IDT 430 are separated from the substrate 420 by the piezoelectric plate 410 and the BOX layer 422. The low thermal conductivity of the piezoelectric layer and BOX layer presents a substantial barrier to efficient heat removal from the substrate and through the contact pads and bumps, to the package. The large thermal resistance of the plate 410 and BOX layer 422 block heat from efficiently escaping from the substrate 420, through the contact pads and contact bumps of XBAR 400, and into the package to cool the XBAR diaphragm of XBAR 400.

Figure 5A:
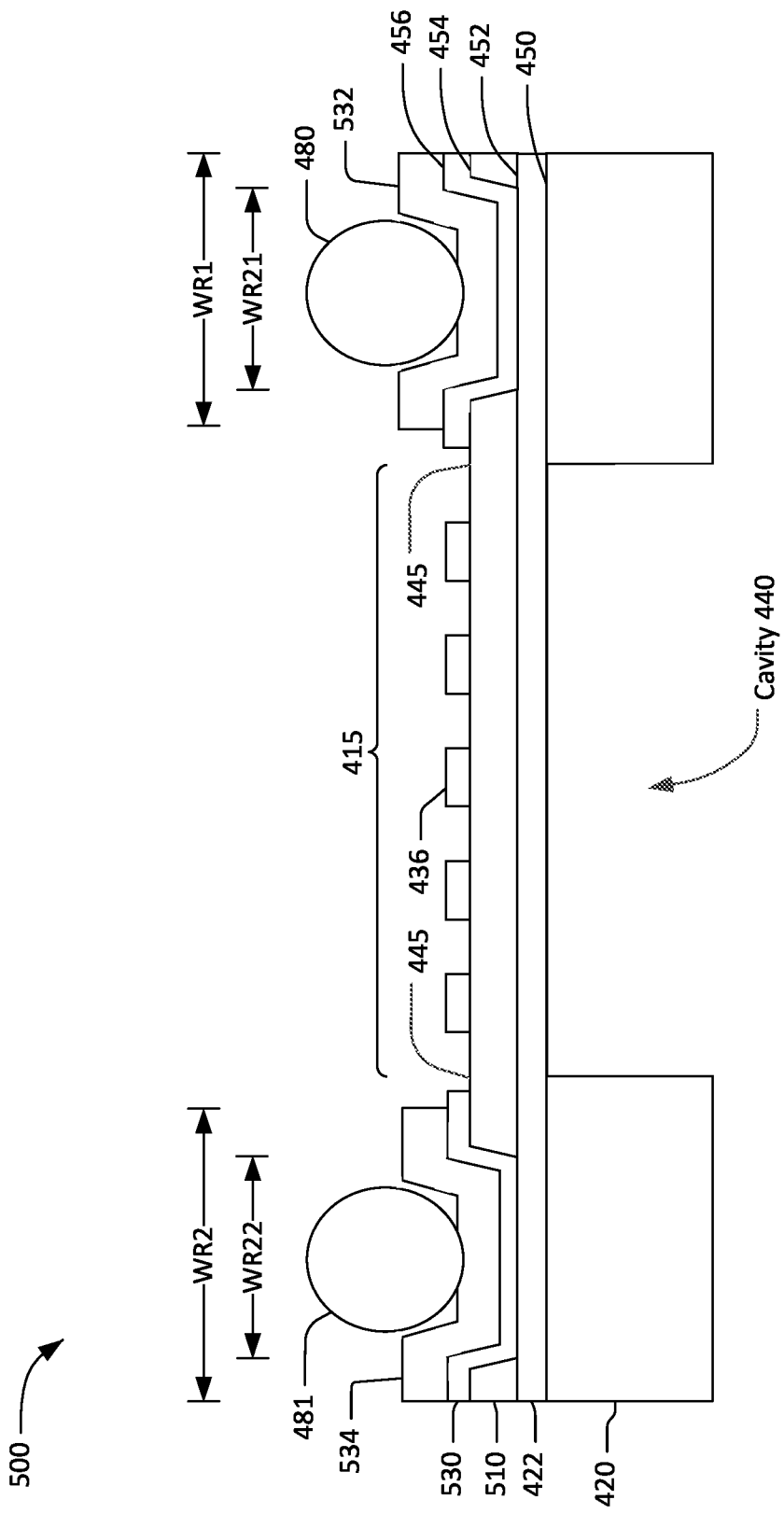
FIG. 5A is a schematic cross-sectional view of an improved XBAR with the piezoelectric plate removed from a least a portion of the surface area of the device beneath the contact pads.
Figure 7A:
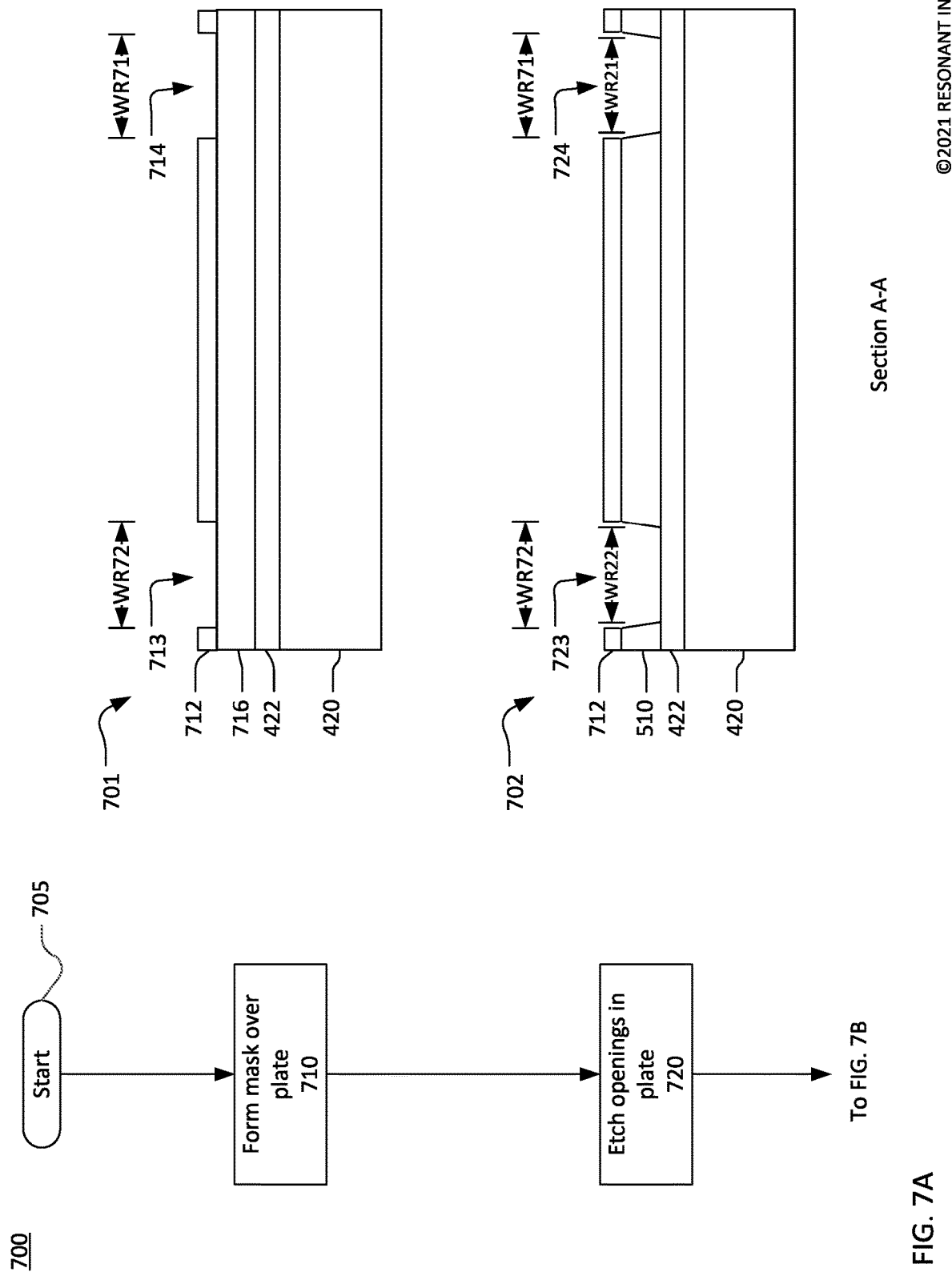
FIG. 7A and FIG. 7B (collectively "FIG. 7") are a flow chart of a process for fabricating an XBAR with the piezoelectric plate removed from a least a portion of the surface area of the device beneath the contact pads.
Figure 7B:
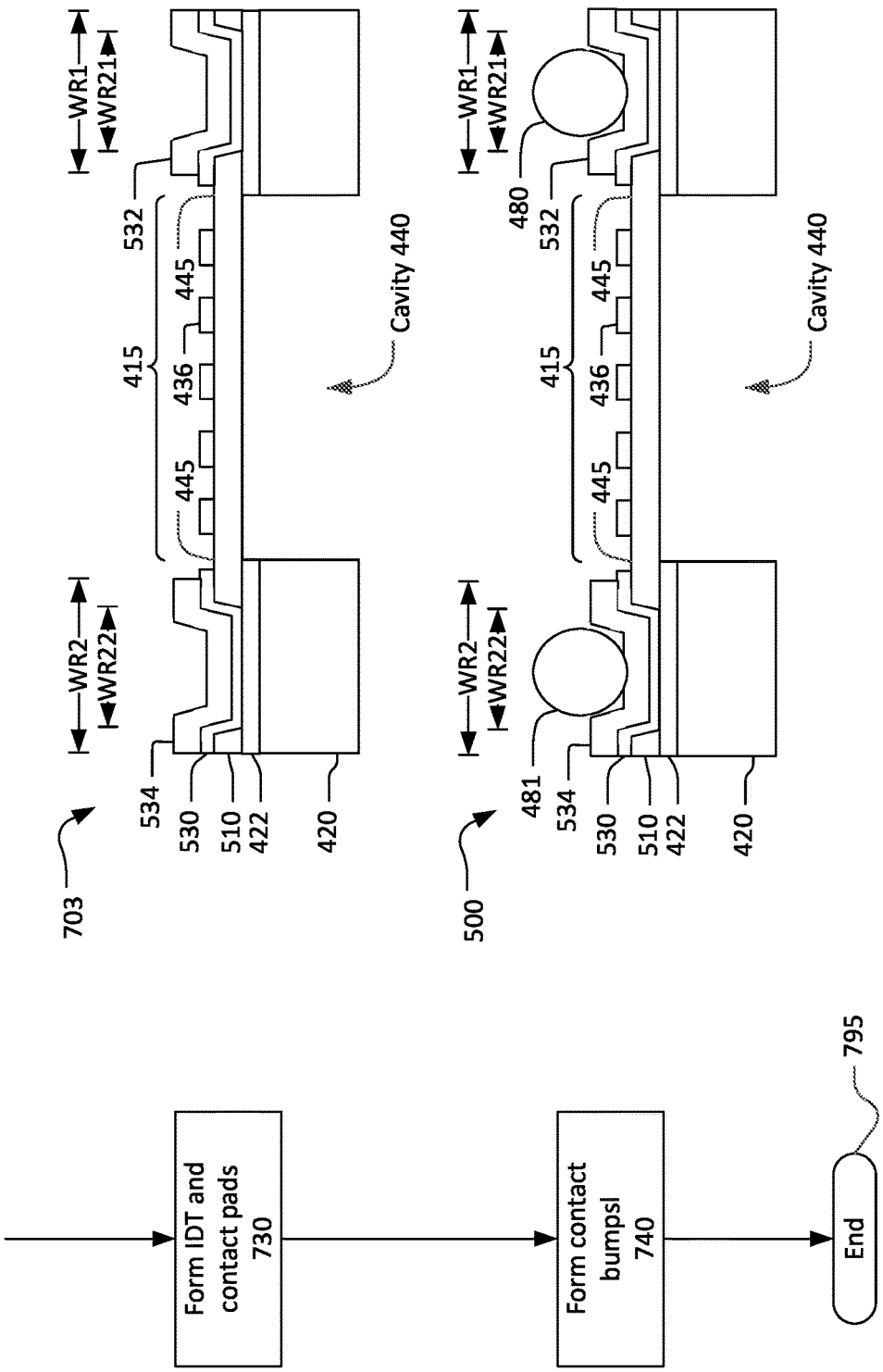

Consequently, the bump-contact pad to the substrate thermal resistance of the XBAR can be improved (e.g., reduced) by removing the associated thermal resistance of the $LiNbO_3$ plate material under the contact pads (e.g., see FIGS. 5A and 7A-B). This removal will create a via hole or opening in the $LiNbO_3$ plate substrate, which then allows direct contact of the Au contact bump and Al contact pad layers to the $SiO_2$ BOX layer to provide lower thermal resistance between the contact bumps and the substrate.

For BOX layers exceeding 1-2 μm in thickness, this thermal resistance can be further improved by removing or thinning the BOX layer material under the contact pads, as well (e.g., see FIGS. 5B and 8A-C). Removing the BOX layer and plate layer forms a thermal via that extends from the contact pad into an electrically isolating layer or into the substrate to provide lower thermal resistance between the contact bumps and the substrate.

FIG. 5A is a schematic cross-sectional view of an improved XBAR 500 with the piezoelectric plate 410 removed from a least a portion of the surface area of the device beneath the contact pads 532 and 534 to provide lower thermal resistance between the contact bumps and the substrate. XBAR 500 has substrate 420 having a cavity 440. XBAR 500 may be a version of any of XBARs 100, 300 and/or 350. Substrate 420 has substrate top surface 450; bonding oxide (BOX) layer 422 has BOX top surface 452; plate 510 has plate top surface 454; and IDT 530 has top surface 456. The plate 510 has a plate back surface that is mounted on the BOX top surface 452; and BOX layer 422 has a back surface that is mounted on substrate top surface 450 at the perimeter 445 of cavity 440. BOX layer 422 may be removed from the bottom surface of plate 510 in the area of cavity 440 such that that cavity extends upwards to the bottom surface of the plate 510 only in the area of cavity 440.

A portion of the piezoelectric plate 510 that is not attached to BOX layer 422 over substrate 420 around (and possibly beyond) perimeter 445 forms diaphragm 415 that spans the cavity 440. An interdigital transducer (IDT) 530 is formed on a front surface 454 of the piezoelectric plate 510 such that interleaved fingers 436 of the IDT are disposed on the diaphragm 415. Cavity 440 can be formed before, during or after any of the other components of the XBAR 500 such as any of steps shown in FIG. 7.

BOX layer 422 may be layer 122 or 322. BOX layer 422 may be silicon thermal oxide (TOX), $SiO_2$, $Si_3O_4$, $Si_3N_4$ and/or another dielectric oxide material. BOX layer 422 may be a polycrystalline silicon (poly-Si) bonding layer having a thickness of 1-10 µm. Substrate 420 may be polymorphic or crystalline silicon (Si) having a thickness of 250-500 µm.

XBAR 500 has the piezoelectric plate 510 removed from a least a portion of each of surface areas WR1 and WR2 of surface 452 of the BOX layer 422 beneath the contact pads 532 and 534 to provide lower thermal resistance between the contact bumps and the substrate. In some cases, the areas WR1 and WR2 beneath each of the contact pads include predetermined areas WR21 and WR22 of top surface 452 of the BOX layer 422 at selected locations of that top surface to provide a predetermined amount in reduction of thermal resistance between the contact pads 532 and 534 and the substrate 420. The selected locations and predetermined areas may be selected to provide proper electrical contact between the IDT 530 and the package and/or to provide the predetermined amount in reduction of thermal resistance between the contact pads 532 and 534 and the substrate 420.

Thus, contact pads 532 and 534 are formed on IDT 530 which is formed on or attached directly to BOX layer 422 over areas WR21 and WR22, as shown. The piezoelectric plate 510 has been removed from a least each of areas WR21 and WR22 of the surface area of surface 452 of the BOX layer 422 beneath the contact pads 532 and 534 to provide lower thermal resistance between the contact bumps and the substrate. Contact bumps 480 and 481 are formed on, bonded to, or attached to the top surface of the contact pads 532 and 534, respectively, over areas WR21 and WR22, as shown.

Each of the contact pads 532 and 534 may range from 50 µm to 300 µm in diameter or width. Their cross sections may be circular, square, elliptical or rectangular. The contact pads 532/534 are formed of a metal or conductor as noted for pads 432/434.

Each of the contact pads 432 and 434 is or includes a metal layer that is attached to areas WR1 and WR2 of IDT 530 that is attached to the bonding layer 422; and a side surface and part of a top surface of the piezoelectric layer 510. The metal layer is attached to a top surface 456 and side surfaces of the IDT and is electrically connected to the busbars of the IDT.

BOX layer 422 provides electrical isolation between substrate 420 and contact pads 432 and 434. For example, BOX layer 422 may be a trap-rich layer with high electrical resistance formed over the surface of substrate 420 at the areas WR1 and WR2 that is sufficient to ensure the electrical isolation path between substrate 420 and the contact pads.

For XBAR 500, the primary mechanism for removing heat from the XBAR diaphragm 415, such as heat generated by the IDT and plate over cavity 440 is conduction through the IDT fingers 436 to the substrate 420 and then from the substrate through the contact pads 532/534 and contact bumps 480 and 481 to a package of the XBAR (not shown but attached to the contact bumps and housing the XBAR). Here, the contact pads 532 and 534 and other conductors of the conductor pattern or IDT 530 are not separated from the substrate 420 by the piezoelectric plate 410. Thus, the low thermal conductivity of the piezoelectric layer does not present a substantial barrier to efficient heat removal from the substrate and through the contact pads and bumps, to the package. In this case, the large thermal resistance of the plate 410 will not block heat from efficiently escaping from the substrate 420, through the contact pads and contact bumps of XBAR 500, and into the package to cool the XBAR diaphragm 415 of XBAR 500. This reduces the temperature rise of a given plate resonator for a given input heat load.

Figure 5B:
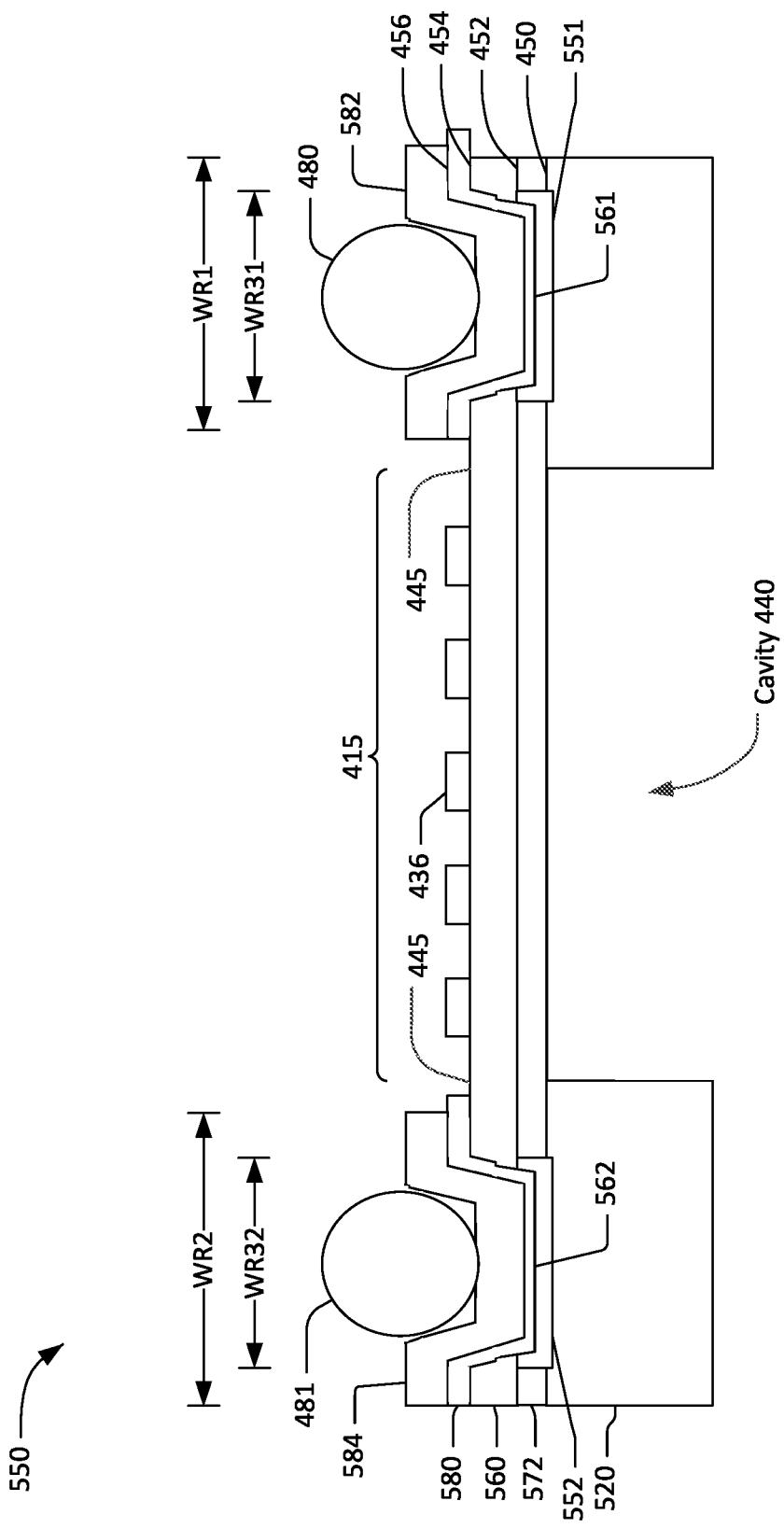
FIG. 5B is a schematic cross-sectional view of an improved XBAR with the piezoelectric plate and bonding oxide (BOX) layer removed from a least a portion of the surface area of the device beneath the contact pads.

FIG. 5B is a schematic cross-sectional view of an improved XBAR 550 with the piezoelectric plate 560 and bonding oxide (BOX) layer 572 removed from a least a portion of the surface area of the device beneath the contact pads 582 and 584 to provide lower thermal resistance between the contact bumps and the substrate. Substrate 520 has substrate top surface 450; bonding oxide (BOX) layer 572 has BOX top surface 452; plate 560 has plate top surface 454; and IDT 580 has top surface 456. The plate 560 has a plate back surface that is mounted on the BOX top surface 572; and BOX layer 572 has a back surface that is mounted on substrate top surface 450 at the perimeter 445 of cavity 440. BOX layer 572 may be removed from the bottom surface of plate 560 in the area of cavity 440 such that that cavity extends upwards to the bottom surface of the plate 560 only in the area of cavity 440.

A portion of the piezoelectric plate 560 that is not attached to BOX layer 572 over substrate 520 around (and possibly beyond) perimeter 445 forms diaphragm 415 that spans the cavity 440. An interdigital transducer (IDT) 580 is formed on a front surface 454 of the piezoelectric plate 560 such that interleaved fingers 436 of the IDT are disposed on the diaphragm 415. BOX layer 572 may be BOX layer 422 having electrically isolating material 551 and 552. Cavity 440 can be formed before, during or after any of the other components of the XBAR 550 such as any of steps shown in FIG. 8.

XBAR 550 has the piezoelectric plate 560 and BOX layer 572 removed from a least a portion of each of surface areas WR1 and WR2 of surface 452 of the BOX layer 472 beneath the contact pads 582 and 584 to provide lower thermal resistance between the contact bumps and the substrate. In some cases, the areas WR1 and WR2 beneath each of the contact pads include predetermined areas WR31 and WR32 of top surface 452 of the BOX layer 572 at selected locations of that top surface to provide a predetermined amount in reduction of thermal resistance between the contact pads 582 and 584 and the substrate 520.

Electrically isolating layers 551 and 552 (e.g., of SiO2) are mounted in areas WR31 and WR32 between the substrate top surface 450 and the bottom surface of the IDT 580. The bottom surface of the IDT 580 is formed on and attached to top surfaces 561 and 562 of the isolating layers 551 and 552; and the bottom surfaces of the isolating layers 551 and 552 are attached to the substrate 520 at areas WR31 and WR32. In some cases, layers 551 and 552 extend below the surface 450, such as by a few to a dozen microns. Layers 551 and 552 electrically insulate contact pads 582 and 584 from the substrate 520. Layers 551 and 552 may also electrically insulate the BOX layer 572 and plate 560 from the substrate 520.

Electrically isolating layers 551 and 552 may be silicon thermal oxide (TOX), $SiO_2$, $Si_3O_4$, $Si_3N_4$ and/or another dielectric oxide material. They may be formed of a dielectric material, such as silicon oxide (SiO2) having a thickness of 1-2 μm deposited on the substrate. Substrate 520 may be substrate 420, such as of a polymorphic or crystalline silicon (Si) having a thickness of 250-500 μm.

Thus, contact pads 582 and 584 are formed on IDT 580 which is formed on or attached directly to layers 551 and 552 over areas WR31 and WR32, as shown. The piezoelectric plate 560 and BOX layer 572 have been removed from a least each of areas WR31 and WR32 of the surface area of surface 450 of the substrate 520 beneath the contact pads 582 and 584 to provide lower thermal resistance between the contact bumps and the substrate. Contact bumps 480 and 481 are formed on, bonded to, or attached to the top surface of the contact pads 582 and 584, respectively, over areas WR31 and WR32, as shown.

Each of the contact pads 582 and 584, and each of the layers 551 and 552, may range from 50 μm to 300 μm in diameter or width. Their cross sections may be circular, square, elliptical or rectangular. The depth of the layers 551 and 552 into the substrate 520 may range from 0.1% to 2% of the substrate thickness. The contact pads 582/584 are formed of a metal or conductor as noted for pads 432/434.

Each of the contact pads 582 and 584 is or includes a metal layer that is attached to areas WR1 and WR2 of IDT 580 that is attached to a top surface of the layers 551 and 552; and a side surface and part of a top surface of the piezoelectric layer 560. The metal layer of the pads is attached to a top surface 456 and side surfaces of the IDT 580 and is thus electrically connected to the busbars of the IDT.

In some cases, the areas WR1 and WR2 of the device beneath each contact pads extend away from or are more than between 5 and 25 percent past a length and width of the perimeter 445 of the cavity 440. For example, contact pads 532 and 534 (and 582 and 584) extend more than between 5 and 25 percent of the total length and width beyond the length and width of the perimeter 445 of the cavity 440. Dielectric or isolating layer 551 and 552 (e.g., of SiO2) may be mounted on substrate top surface 450 between 5 and 25 percent of the total length and width beyond the perimeter 445 of cavity 440.

The layers 551 and 552 over areas WR31 and WR32 provide electrical isolation between substrate 520 and contact pads 582 and 584. For example, the layers 551 and 552 may have high electrical resistance between the surface of substrate 520 at the areas WR31 and WR32 that is sufficient to ensure an electrical isolation path between substrate 520 and the contact pads 582 and 584.

For XBAR 550, the primary mechanism for removing heat from the XBAR diaphragm 415, such as heat generated by the IDT and plate over cavity 440 is conduction through the IDT fingers 436 to the substrate 520 and then from the substrate through the contact pads 582/584 and contact bumps 480 and 481 to a package of the XBAR (not shown but attached to the contact bumps and housing the XBAR). Here, the contact pads 582 and 584 and other conductors of the conductor pattern or IDT 580 are not separated from the substrate 520 by the piezoelectric plate 560 and BOX layer 572. Thus, the low thermal conductivity of the piezoelectric layer and BOX layer does not present a substantial barrier to efficient heat removal from the substrate and through the contact pads and bumps, to the package. In this case, the large thermal resistance of the plate 560 and BOX layer 572 will not block heat from efficiently escaping from the substrate 520, through the contact pads and contact bumps of XBAR 550, and into the package to cool the XBAR diaphragm 415 of XBAR 550. This reduces the temperature rise of a given plate resonator for a given input heat load.

As noted, the contact bumps 480 and 481 of XBARs 400, 500 and 550 may be attached to a package of the XBAR, such as mounted above and onto the top of those bumps. The package may be or contain a printed circuit board (PCB) that includes a PCB board and metal traces. It may be formed by high-temperature co-fired ceramics (HTCC) with signal routing (e.g., vias, traces and contact pads). In some cases, the package is a PCB laminate with copper (Cu) signal routing. It may be formed by known PCB processes and have known signal routing.

Removing the BOX layer and/or plate may be performed using a thin box frontside etch. Different etchants may be used for the BOX layer than for the plate, such as by using a wet etch or a dry etch for either. The etching could require multiple photolithography processing steps.

FIG. 6 is a table 600 showing a bump to substrate thermal resistance analysis of XBAR devices with and without the piezoelectric plate and bonding oxide (BOX) layer removed from a least a portion of the surface area of the device beneath the contact pads to provide lower thermal resistance between the contact bumps and the substrate. Table 600 may be a spreadsheet estimate of BOX layer and a LN piezoelectric layer plate impact on XBAR heat conduction. Thermal resistance for contacts, bumps, IDTs, resonator diaphragms, circuit boards or other components of the XBAR device may be simulated or measured in C/W.

The first row of table 600 shows the legend of data labels for the columns of the table. The second to sixth rows show the values in the columns for the simulations of an XBAR device without removing the piezoelectric plate from and for various thickness of bonding oxide (BOX) layer at least a portion of the surface area of the device beneath the contact pads such as in FIG. 4. In the second to sixth rows, a bump to substrate thermal resistance analysis performed with BOX layer 422 having varying SiO2 thickness under plate 410 having 0.5 μm thick LN material; and 100 μm×100 μm surface area contact pads 432 and 434. References to "bumps" in the table may be to bonding pads, gold bumps or solder bumps, or other means for making connection between the device (e.g., conductor layers or busbars) and external circuitry.

The seventh to eleventh rows of table 600 show the values in the columns for the simulations of an XBAR device with the piezoelectric plate removed from and for various thickness of bonding oxide (BOX) layer at least a portion of the surface area of the device beneath the contact pads such as in FIG. 5A. In the seventh to eleventh rows, a bump to substrate thermal resistance analysis performed with BOX layer 422 having varying SiO2 thickness and no plate 510 of thick LN material; and 100 μm×100 μm surface area contact pads 532 and 534.

As can be seen in the final column, "Relative Change" in bump to substrate thermal resistance, removing the piezoelectric plate from a least a portion of the surface area of the device beneath the contact pads in column eight improves or reduces bump to substrate thermal resistance by 15% for 1 urn SiO2 of BOX layer 422. The other thicknesses of BOX layer 422 for rows nine to eleven also show reduced bump to substrate thermal resistance. Thus, the XBAR 500 and 550 are more desirable that XBAR 400. This is because with the plate removed from under the contact pads, the large thermal resistance of the piezoelectric plate 510 or 560 will not block heat from efficiently escaping from the substrate 420 or 520, through the contact pads and contact bumps of XBAR 500 and 550, and into the package to cool the XBAR diaphragm 415 of those XBARs as shown in rows seven through eleven of FIG. 6. On the other hand, without removing the plate, the plate 410 will block the heat of XBAR 400 as shown in rows two through six of FIG. 6.

Description of Methods

FIG. 7A and FIG. 7B (collectively "FIG. 7") are a flow chart of a process for fabricating an XBAR with the piezoelectric plate removed from a least a portion of the surface area of the device beneath the contact pads. The process 700 uses a mask or photoresist over the plate and a vertical etch-stop under the plate. It can use photolithography to pattern holes in the LN plate. To the right of each action in the flow chart is a schematic cross-sectional view representing the end of each action.

The process 700 starts at 705 with a device having substrate 420 and a plate of piezoelectric material 716 bonded to a substrate 420 using a bonding oxide (BOX) layer 422 and ends at 795 with a completed XBAR or filter. The piezoelectric plate may be a portion of wafer of piezoelectric material. The piezoelectric plate and the substrate may be bonded by a wafer bonding process that uses the BOX layer 422. The flow chart of FIG. 7 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 7.

After 705, the process 700 continues to 710 where device 701 has a mask 712 formed over the plate 716 of the device of step 705. Mask 712 may be a photoresist deposited on and bonded to the top surface of the plate. Mask 712 has openings 713 and 714 in areas WR71 and WR72 that extend through the mask and to the top surface of the plate. The openings may be holes through the mask that are formed by photolithography to pattern holes in a photoresist 712 at the areas WR71 and WR72. Areas WR71 and WR72 are equal to or larger than areas WR21 and WR22; and equal to or smaller than areas WR1 and WR2.

After 710, at 720 device 702 has the plate 716 etched through at openings 713 and 714 in mask 712 to form openings 723 and 724 through the plate 716 and to the BOX layer 422 of the device 701 of step 710. The etched plate 510 has openings 723 and 724 in areas WR71 and WR72 that extend through the plate and to the top surface of the BOX layer at predetermined locations and predetermined in areas WR21 and WR22. The openings may be holes through the plate that are formed by wet or dry etching away of the plate at areas WR21 and WR22 with respect to the mask 712. The etching may be done by an ion milling, a reactive ion etching (RIE), an inductively coupled plasma (ICP) and/or a laser milling process. The BOX layer 422 may function as a vertical etch-stop under the plate to stop the etching at or just below (e.g., 1-5 percent of the layer thickness) the top surface of the BOX layer. Areas WR71 and WR72; or areas WR21 and WR22 may be locations for each of contact pads 532 and 534 to be formed at step 730.

After 720, at 730 device 703 has the IDT 530 and contact pads 532 and 534 formed in and through openings 723 and 724, through the plate 510, and to the BOX layer 422 of the device 702 of step 720. Step 730 may include removing the mask 712. In other cases, the mask 712 may be further patterned to form the IDT 530. The IDT 530 is formed onto the plate 510 and formed through openings (not shown) that extend through the plate and to the top surface of the BOX layer at predetermined locations and predetermined in areas WR21 and WR22, as shown. These opening may be similar to openings 723 and 724 in areas WR71 and WR72, but after the mask 712 is removed.

The contact pads 532 and 534 are then formed onto the top surface of the IDT 530 at areas WR2 and WR1, over predetermined locations, and over predetermined areas WR21 and WR22. The IDT 530 includes fingers 536, busbars and electrical connections from the fingers through the busbars and to the contact pads. Cavity 440 is formed in substrate 420. A portion of the plate 510 over the cavity within cavity perimeter 445 forms diaphragm 415.

Forming IDT 530 at 730 may include forming conductor patterns and dielectric layers defining one or more XBAR devices on the surface of the piezoelectric plate 510. Typically, a filter device will have an IDT as a first of two or more conductor layers that are sequentially deposited and patterned. The IDT 530 layers may be, for example, aluminum, an aluminum alloy, copper, a copper alloy, molybdenum, tungsten, beryllium, gold, or some other conductive metal. Optionally, one or more layers of other materials may be disposed below (i.e. between the IDT layer and the piezoelectric plate) and/or on top of the IDT. For example, a thin film of titanium, chrome, or other metal may be used to improve the adhesion between the IDT layer and the piezoelectric plate.

The IDT 530 may be formed at 730 by depositing the conductor layers over the surface of the piezoelectric plate and BOX layer; and removing excess metal by etching through a patterned photoresist that covers areas W1 and W2 as well as other areas of the IDT 530. Alternatively, the IDT 530 may be formed at 730 using a lift-off process. Photoresist may be deposited over the piezoelectric plate and BOX layer and patterned to remove areas that define the IDT 530. The IDT material may be deposited in sequence over the surface of the photoresist, piezoelectric plate and BOX layer. The photoresist may then be removed, which removes the excess material, leaving the IDT 530, including at areas W21 and W22.

Forming contact pads 532 and 534 at 730 may include forming conductor patterns and dielectric layers on the surface of the IDT 530. Typically, a filter device will have contact pads after the first (e.g., IDT) of two or more conductor layers that are sequentially deposited and patterned. The contact pads may be, for example, aluminum, an aluminum alloy, copper, a copper alloy, molybdenum, tungsten, beryllium, gold, or some other conductive metal. Optionally, one or more layers of other materials may be disposed below (i.e. between the pads and the IDT) and/or on top of the contact pads. For example, a thin film of titanium, chrome, or other metal may be used to improve the adhesion between the contact pads and the IDT.

The contact pads 532 and 534 may be formed at 730 by depositing the conductor layers over the surface of the IDT 530; and removing excess metal by etching through a patterned photoresist that covers areas W1 and W2. Alternatively, the contact pads 532 and 534 may be formed at 730 using a lift-off process. Photoresist may be deposited over the piezoelectric plate and IDT; and patterned to remove areas that define the contact pads 532 and 534. The contact pad material may be deposited in sequence over the surface of the plate and IDT 530. The photoresist may then be removed, which removes the excess material, leaving the contact pads 532 and 534 at areas W1 and W2.

Forming at 730 may include forming one or more dielectric layers on the plate and/or IDT, such as a front side dielectric, a back side dielectric and/or a passivation layer as noted herein. The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

The one or more dielectric layers may also include, for example, depositing an encapsulation/passivation layer such as $SiO_2$ or $Si_3O_4$ over all or a portion of the device.

Cavity 440 is shown formed at step 730. However, the cavity can be formed before, during or after any of the steps of process 700. The cavity may be a swimming pool cavity. It may be either back etched or front etched through the plate. A separate cavity may be formed for each resonator in a filter device.

After 730, at 740 device 500 has the contact bumps 480 and 481 formed on contact pads 532 and 534 of the device 703 of step 730. The bumps may be formed by patterning a mask, screen or other layer over the device of step 730 to have openings at areas WR1 and WR2, then depositing the bump material onto and through the mask. Then, the bump material may be heated or flowed to bond to the pads; and the mask removed. In some cases the order of heating and removing may be reversed.

Contact bumps 480 and 481 are solder bumps, gold bumps or other means for making electrical connections between the XBAR device 500 and external circuitry. They may be for electrically and thermally connecting the contact pads 532 and 534 to opposing contact pads of a package device that packages the XBAR.

As noted at FIG. 5A, for XBAR 500, the large thermal resistance of the plate 410 will not block heat from efficiently escaping from the substrate 420, through the contact pads and contact bumps 480 and 481 of XBAR 500, and into the package to cool the XBAR diaphragm 415 of XBAR 500.

Forming at 740 may also include excising individual devices from a wafer containing multiple devices; other packaging steps; and testing. Another action that may occur at 740 is to tune the resonant frequencies of the resonators within a filter device by adding or removing metal or dielectric material from the front side of the device.

The process 700 ends at 795 with a completed XBAR or filter 500.

Figure 8A:
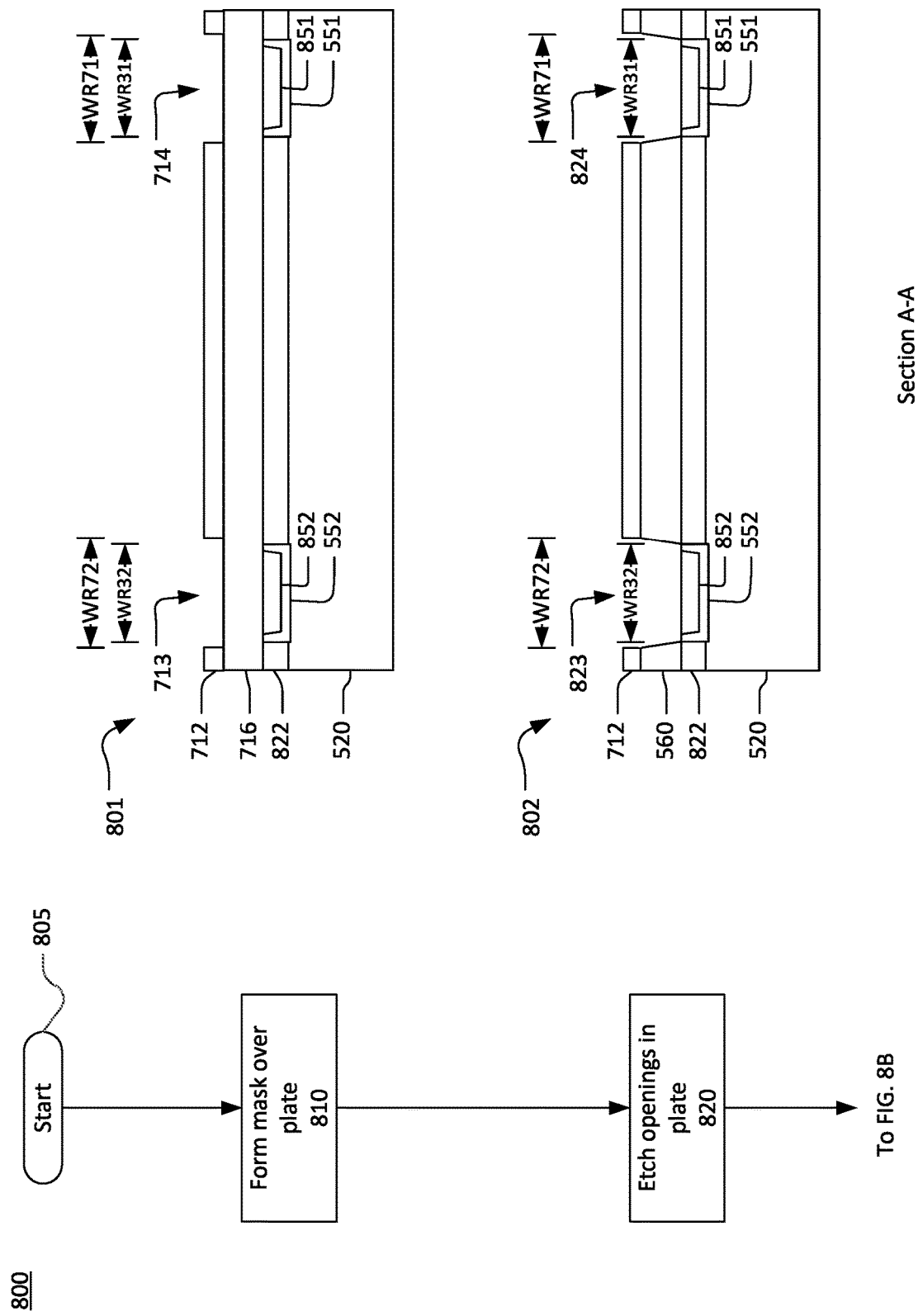

FIG. 8A, FIG. 8B, and FIG. 8C (collectively "FIG. 8") are a flow chart of a process for fabricating an XBAR with the piezoelectric plate and bonding oxide (BOX) layer removed from a least a portion of the surface area of the device beneath the contact pads. The process 800 uses a mask or photoresist over the plate and a vertical etch-stop of sacrificial material under the BOX layer. It can use photolithography to pattern holes in the LN plate and the sacrificial material. To the right of each action in the flow chart is a schematic cross-sectional view representing the end of each action.

The process 800 starts at 805 with a device having a substrate 520 and a plate of piezoelectric material 716 bonded to a substrate 520 using a bonding oxide (BOX) layer 822 and ends at 895 with a completed XBAR or filter. The piezoelectric plate and the substrate may be bonded by a wafer bonding process that uses the BOX layer 822. The flow chart of FIG. 8 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 8.

After 805, the process 800 continues to 810 where device 801 has a mask 712 formed over the plate 716 of the device of step 805. Mask 712 may be a photoresist and has openings 713 and 714 in areas WR71 and WR72 as noted for FIG. 7.

As shown, for device 801 and as similar for the device at 805 prior to forming mask 712 over the plate 716, the BOX layer 822 has predetermined areas WR31 and WR32 of an electrically isolating layer 551 and 552, and areas of sacrificial material 851 and 852 above the areas WR31 and WR32, on the top surface of the electrically isolating material and below the plate. The bottom surface of the plate is bonded to or touching the top surface of the sacrificial material 851 and 852. Thus, there is no BOX layer material 822 or 572 between the plate and substrate at areas WR31 and WR32; there is only the electrically isolating layers 551 and 552 on the top of the substrate 520 and the sacrificial material 851 and 852 between the isolating material and the plate. At 810 the mask 712 is formed over the plate 716.

The electrically isolating layers 551 and 552 may be silicon thermal oxide (TOX), $SiO_2$, $Si_3O_4$, $Si_3N_4$ and/or another dielectric oxide material. The sacrificial material 851 and 852 may be polycrystalline silicon and/or another polycrystalline material. Other sacrificial materials include lithium titanate (LTO), Si3N4, and SiC.

After 810, at 820 device 802 has the plate 716 etched through at openings 713 and 714 in mask 712 to form openings 823 and 824 through the plate 716 and to the sacrificial layers 851 and 852 of the device 801 of step 810.

The etched plate 560 has openings 823 and 824 in areas WR71 and WR72 that extend through the plate and to the top surface of the sacrificial layers 851 and 852 at predetermined locations and predetermined in areas WR31 and WR32. The openings may be holes through the plate that are formed by wet or dry etching away of the plate at areas WR31 and WR32 with respect to the mask 712. The etching may be done by an ion milling, a reactive ion etching (RIE), an inductively coupled plasma (ICP) and/or a laser milling process. The sacrificial layers 851 and 852 (and optionally parts of electrically isolating layers 551 and 552) may function as a vertical etch-stop under the plate to stop the etching at or just below (e.g., 1-5 percent of the layer thickness) the top surface of the layers 851 and 852.

After 820, at 825 device 803 has the sacrificial layers 851 and 852 etched through at openings 823 and 824 in mask 712 to form openings 833 and 834 through the plate 716, through the sacrificial layers 851 and 852, and to the top of the electrically material layers 551 and 552 of the device 802 of step 820.

The etched sacrificial layers 851 and 852 have openings 833 and 834 in areas WR71 and WR72 that extend through the plate and sacrificial layers 851 and 852, and to the top surface of the electrically material layers 551 and 552 at predetermined locations and predetermined in areas WR31 and WR32. The openings may be holes through the plate and sacrificial layers 851 and 852 that are formed by wet or dry etching away of the and sacrificial layers 851 and 852 at areas WR31 and WR32 with respect to the mask 712. The etching may be done by an ion milling, a reactive ion etching (RIE), an inductively coupled plasma (ICP) and/or a laser milling process. In some cases, the etch at step 825 is performed by a frontside membrane release (FSMR) technique which is a process to selectively remove the sacrificial polysilicon material of layers 851 and 852 using a highly selective dry vapor etchant such as XeF2. This process is conducted on the device layer side (e.g., a frontside etch through areas WR71 and WR72) as opposed to the backside release where a through hole needs to be created in the Si substrate to gain access to the sacrificial material. The electrically isolating layers 551 and 552 may function as a vertical etch-stop under the sacrificial layers 851 and 852 to stop the etching at or just below (e.g., 1-5 percent of the layer thickness) the top surface of the layers 551 and 552.

Areas WR71 and WR72; or areas WR31 and WR32 may be locations for each of contact pads 532 and 534 to be formed at step 730.

After 820, at 830 device 804 has the IDT 580 and contact pads 582 and 584 formed in and through openings 833 and 834 through the plate 560, through the sacrificial layers 851 and 852, and to the electrically isolating layers 551 and 552 of the device 803 of step 825. Step 830 may include removing the mask 712. In other cases, the mask 712 may be further patterned to form the IDT 580. The IDT 580 is formed onto the electrically isolating layers 551 and 552 through openings (not shown) that extend through the plate, through the sacrificial material 851 and 852, and to the top surfaces 561 and 562 of the electrically isolating layers 551 and 552 at predetermined locations and in predetermined areas WR31 and WR32, as shown. These opening may be similar to openings 823 and 824 in areas WR71 and WR72, but after the mask 712 is removed.

The contact pads 582 and 584 are then formed onto the top surface of the electrically isolating layers 551 and 552 at areas WR2 and WR1 over predetermined locations, and over predetermined areas WR31 and WR32. The IDT 580 includes fingers 536, busbars and electrical connections from the fingers through the busbars and to the contact pads. Cavity 440 is formed in substrate 520. A portion of the plate 560 over the cavity within cavity perimeter 445 forms diaphragm 415.

Forming IDT 580 at 830 may include forming conductor patterns and dielectric layers as noted for forming IDT 530 at step 730.

The IDT 580 may be formed at 830 by depositing the conductor layers over the surface of the piezoelectric plate and electrically isolating layers 551 and 552; and removing excess metal by etching through a patterned photoresist that covers areas W1 and W2 as well as other areas of the IDT 580. Alternatively, the IDT 580 may be formed at 830 using a lift-off process. Photoresist may be deposited over the piezoelectric plate and electrically isolating layers 551 and 552 and patterned to remove areas that define the IDT 580. The IDT material may be deposited in sequence over the surface of the photoresist, piezoelectric plate and electrically isolating layers 551 and 552. The photoresist may then be removed, which removes the excess material, leaving the IDT 580, including at areas W31 and W32.

Forming contact pads 582 and 584 at 830 may include forming conductor patterns and dielectric layers on the surface of the IDT 580, similar to forming pads 532 and 534 on IDT 560. After forming the IDT and contact pads at 830, BOX layer 822 becomes BOX layer 572.

Forming contact pads 582 and 584 at 830 may include depositing the conductor layers over the surface of the IDT 580 and removing excess metal by etching through a patterned photoresist that covers areas W1 and W2. Alternatively, the contact pads 582 and 584 may be formed at 830 using a lift-off process as noted for forming the contact pads 532 and 534 over IDT 530.

In some cases, at 830 an additional metal fill is added on top of the originally formed contact pads 582 and 584 at 830. This additional fill may be depositing the conductor layers over the contact pads 582 and 584, and removing excess metal by etching; or using a lift-off process as noted for forming the contact pads 532 and 534 over IDT 530.

Forming at 830 may include forming one or more dielectric layers on the plate and/or IDT, such as a front side dielectric, a back side dielectric and/or an encapsulation/passivation layer as noted at step 730. The different thickness of these dielectric layers causes the selected XBARs to be tuned to different frequencies as noted at step 730.

Cavity 440 is shown formed at step 830. However, the cavity can be formed before, during or after any of the steps of process 800.

After 830, at 840 device 550 has the contact bumps 480 and 481 formed on contact pads 582 and 584 of the device 804 of step 830. The bumps may be formed of materials and using processes as noted for step 740.

Contact bumps 480 and 481 make electrical connections between the XBAR device 550 and external circuitry as noted for device 500 and step 740.

As noted at FIG. 5B, for XBAR 550, the large thermal resistance of the plate 410 and BOX layer 822 will not block heat from efficiently escaping from the substrate 520, through the contact pads and contact bumps 480 and 481 of XBAR 550, and into the package to cool the XBAR diaphragm 415 of XBAR 550.

Forming the bumps at 840 may also include excising individual devices from a wafer containing multiple devices; other packaging steps; testing; and turning as noted at step 740.

The process 800 ends at 895 with a completed XBAR or filter 550.

As illustrated in table 600, for a buried oxide (BOX) layer, such as BOX layer 422, having a thickness greater than several μm, removing the LN plate under the contact pads, alone has a marginal impact on reducing the bump to substrate thermal resistance. This is because, when the material of BOX layer 422 is poly-Si used as bonding layer between Si substrate and LN plate; the BOX layer material has thermal conductivity that ranges from 10% to 50% of the thermal conductivity of bulk Si substrate. Thus, BOX layer 422 of poly-Si has a greater thermal resistance than a same thickness of the bulk Si of the substrate 420. To improve this situation, it is possible to create XBAR 550 (e.g., using process 800) having thermal vias that extend into the BOX layer 572 using a pre-patterned via, front-side membrane release (e.g., release or etch of sacrificial material 851 and 852 at step 825) to form the XBAR 550, using the same pre-pattern process as the membranes (e.g., release or etch of plate 716 at step 820).

This process 800 may not be necessary for poly-Si BOX layer 422 with good thermal transport properties. In another case, the BOX layer or an electrically isolating layer is thin enough as noted at rows 1-2 and 5-6 of table 600. For example, the electrically isolating layers 551 and 552 can be used instead of BOX layer 422 to reduce the thermal resistance between the contact bumps and substrate; and to electrically isolate the contact pads from the substrate 520. To provide some electrical isolation of the thermal via from the pure Si substrate 520, electrically isolating layers 551 and 552 can be a thin, typically 50-100 nm thick oxide film.

In some cases, the areas WR1 and WR2 beneath each of the contact pads include predetermined areas WR21 and WR22 of top surface 452 of the BOX layer 422 at selected locations of that top surface to provide a predetermined amount in reduction of thermal resistance between the contact pads 532 and 534 and the substrate 420. The selected locations and predetermined areas may be selected to provide proper electrical contact between the IDT 530 and the package and/or to provide the predetermined amount in reduction of thermal resistance between the contact pads 532 and 534 and the substrate 420.

Figure 9:
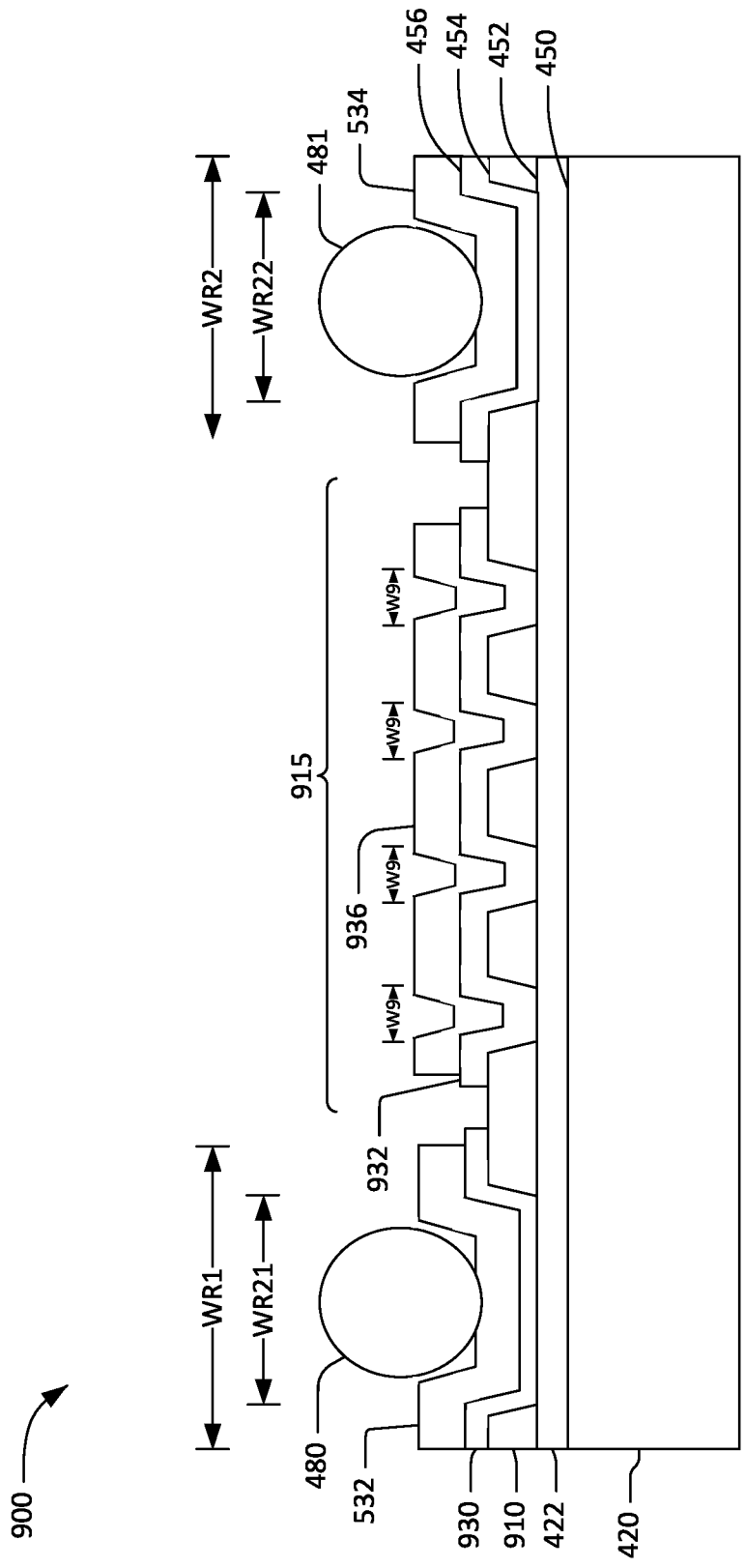
FIG. 9 is a schematic cross-sectional view of an improved XBAR with the piezoelectric plate removed from a least a portion of the surface area of the device beneath the contact pads and thermal vias.

FIG. 9 is a schematic cross-sectional view of an improved XBAR 900 with the piezoelectric plate 910 removed from a least a portion of the surface area of the device beneath the contact pads 532 and 534 and thermal vias 915 to provide lower thermal resistance between the air and the substrate.

XBAR 900 has substrate 420 without a cavity 440. XBAR 900 may be added to any of XBARs 100, 300, 350, 500 and/or 550, such as by being located to the side of the resonator diaphragm. For example, in addition to contact pads 532 and 534, XBAR 900 also has thermal vias 915 to lower thermal resistance between the air above the vias, through the BOX layer 422 and to the substrate 420.

Plate 910 has plate top surface 454; and IDT 930 has top surface 456. The plate 910 has a plate back surface that is mounted on the BOX top surface 452. Thermal vias 915 include a portion 932 of the IDT 930 extending through plate 910 and to BOX layer 422 at selected locations and predetermine areas W9. Portions 936 of the contact pad layer of contact pads 532 and 534 are formed on and attached to the top surface of the portion 932, including at areas W9.

Portions 932 can be formed as noted for forming the IDT of any prior embodiments. Portions 936 can be formed as noted for forming the contact pads of any prior embodiments.

The widths W9 may range from 10 μm to 200 μm in diameter or width. Their cross sections may be circular, square, elliptical or rectangular. There may be fewer or more than 4 of them. There may be between 4 and 100 of them.

Plate 910 may be part of a piezoelectric plate that is attached to a BOX layer over a substrate and has a perimeter 445 forming a diaphragm 415 that spans the cavity 440 (not shown) at another location of the XBAR 900. IDT 930 may be part of an IDT such as IDT 510 or 560 that are part of an XBAR and have interleaved fingers, busbars and other electronic connections. Specifically, FIG. 9 shows that vias 915 are located to the right of contact pad 532 and to the left of pad 534; thus, vias 915 are beside and in a different location than diaphragm 415 of XBARS 500 and 550. Vias 915 may be between two of diaphragm 415 of XBARS 500 and 550.

Thermal vias 915 are electrically isolated from the other parts of the IDT, from the contact pads, and from the substrate 420 by BOX layer 422. Thermal vias 915 are electrically isolated by BOX 422 being between the substrate top surface 450 and the bottom surface of the plate 910 and IDT 930.

Thermal vias 915 can be used for thermal management by selecting predetermined location and areas W9 of top surface 452 of the BOX layer 422 to provide a predetermined amount in reduction of thermal resistance between the air above vias 915 and the substrate 420. Thermal vias 915 enable spreading of heat across metal traces (e.g., of the IDT and metal of the contact pad layer), but with via regions that improve heat-sinking to the Si substrate 420, such as through the BOX layer. The vias 915 provide more contact area for heat to go into the substrate. One advantage of using vias 915 is that it is easier to define thermal vias 915 during the prior described processes of etching the plate, forming the IDT and forming the contact pads; than to do any additional photolithography processing steps such as to flow additional metal to lower thermal resistance between the air and substrate, in addition to the processes describe above.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A method of forming a filter device with low thermal impedance comprising:
  forming a bonding oxide (BOX) layer on a surface of a substrate having a cavity;

bonding a piezoelectric plate to the bonding layer and having a portion of the piezoelectric plate forming a diaphragm spanning the cavity;

removing the piezoelectric plate from at least a portion of the surface of the substrate beneath locations for each of contact pads to be formed to provide lower thermal resistance between contact pads and the substrate; and forming a conductor pattern on a front surface of the piezoelectric plate, wherein the conductor pattern contacts the portion of a surface of the BOX layer where the piezoelectric plate was removed, and the conductor pattern includes an interdigital transducer (IDT) with interleaved fingers disposed on the diaphragm over the cavity.

2. The method of claim 1, further comprising forming the contact pads at the selected locations over the surface of the substrate to provide electrical connections between the IDT and contact pads.

3. The method of claim 2, further comprising forming contact bumps on the contact pads.

4. The method of claim 2, wherein removing the piezoelectric plate includes:

patterning the bonded piezoelectric plate; and etching the patterned piezoelectric plate to remove a predetermined area of the piezoelectric plate from selected locations of the surface of the substrate to provide a predetermined amount in reduction of thermal resistance between the IDT and the contact pads.

5. The method of claim 4, wherein removing the predetermined area of the piezoelectric plate includes:

removing the predetermined area of the piezoelectric plate; and then removing the pattern.

6. The method of claim 1, wherein:

the piezoelectric plate and the IDT are configured such that radio frequency signals applied to the IDT excite a primary shear acoustic mode in the piezoelectric plate over the cavity, wherein a thickness of the diaphragm is selected to tune the primary shear acoustic modes in the piezoelectric plate.

7. The method of claim 1, wherein the substrate is Si, the bonding layer is SiO2, the IDT is metal, and the piezoelectric plate is one of lithium niobate or lithium tantalate.

8. A method of forming a filter device with low thermal impedance comprising:

forming a bonding oxide (BOX) layer on a surface of a substrate having a cavity, wherein the BOX layer has as sacrificial layer formed on an electrically isolating layer at selected locations and predetermined areas;

bonding a piezoelectric plate to the bonding layer and having a portion of the piezoelectric plate forming a diaphragm spanning the cavity;

removing the piezoelectric plate and the sacrificial layer from at least a portion of the surface of the substrate beneath locations for each of contact pads to be formed to provide lower thermal resistance between contact pads and the substrate; and forming a conductor pattern on a front surface of the piezoelectric plate, wherein the conductor pattern contacts the portion of a surface of the electrically isolating layer where the piezoelectric plate and sacrificial layer were removed, and the conductor pattern includes an interdigital transducer (IDT) with interleaved fingers disposed on the diaphragm over the cavity.

9. The method of claim 8, further comprising forming the contact pads at the selected locations over the surface of the substrate to provide electrical connections between the IDT and contact pads.

10. The method of claim 9, further comprising forming contact bumps on the contact pads.

11. The method of claim 8, wherein removing the piezoelectric plate and the sacrificial layer includes:

patterning the bonded piezoelectric plate; and etching the patterned piezoelectric plate to remove a predetermined area of the piezoelectric plate and the sacrificial layer from selected locations of the surface of the substrate to provide a predetermined amount in reduction of thermal resistance between the contact pads and the substrate.

12. The method of claim 11, wherein removing the predetermined area of the piezoelectric plate and the sacrificial layer includes:

removing the predetermined area of the piezoelectric plate; then removing the predetermined area of the sacrificial layer; and then removing the pattern.

13. The method of claim 8, wherein:

the piezoelectric plate and the IDT are configured such that radio frequency signals applied to the IDT excite a primary shear acoustic mode in the piezoelectric plate over the cavity, wherein a thickness of the diaphragm is selected to tune the primary shear acoustic modes in the piezoelectric plate.

14. The method of claim 8, wherein the substrate is Si, the bonding layer is SiO2, the IDT is metal, and the piezoelectric plate is one of lithium niobate or lithium tantalate.

15. A method of forming a filter device with reduced substrate to contact bump thermal resistance comprising:

forming a bonding oxide (BOX) layer on a surface of a substrate having a cavity;

bonding a piezoelectric plate to the bonding layer and having a portion of the piezoelectric plate forming a diaphragm spanning the cavity;

removing the piezoelectric plate from at least a portion of the surface of the substrate past a length and width of the perimeter of the cavity to provide lower thermal resistance between contact bumps to be formed on the filter device and the substrate; and forming a conductor pattern on a front surface of the piezoelectric plate, wherein the conductor pattern contacts the portion of a surface of the BOX layer where the piezoelectric plate was removed, and the conductor pattern includes an interdigital transducer (IDT) with interleaved fingers disposed on the diaphragm over the cavity.

16. The method of claim 15, wherein the substrate is Si, the bonding layer is SiO2, the IDT is metal, and the piezoelectric plate is one of lithium niobate or lithium tantalate.

17. The method of claim 15, wherein the cavity has a perimeter; and wherein the least a portion of the surface area of the device extends more than between 5 and 25 percent past a length and width of the perimeter of the cavity.

18. The method of claim 15, further comprising:

forming contact pads at selected locations over the surface of the substrate to provide electrical connections between the IDT and contact bumps to be attached to the contact pads;

wherein the portions from the surface area of the device are beneath each of the contact pads.

19. The method of claim 18, further forming contact bumps on the contact pads.

20. The method of claim 15, wherein removing the piezoelectric plate includes:
   patterning the bonded piezoelectric plate;
   etching the patterned piezoelectric plate to remove the at least a portion of the surface of the substrate past a length and width of the perimeter of the cavity to provide a predetermined amount in reduction of thermal resistance between the IDT and the contact bumps; and
   removing the pattern.

21. The method of claim 15, wherein:
   the piezoelectric plate and the IDT are configured such that radio frequency signals applied to the IDT excite a primary shear acoustic mode in the piezoelectric plate over the cavity, wherein a thickness of the diaphragm is selected to tune the primary shear acoustic modes in the piezoelectric plate.

* * * * *